«12» United States Patent
Nakajima et al.

(10) Patent No.: US 6,815,273 B2
(45) Date of Patent: Nov. 9, 2004

(54) METHOD OF MANUFACTURING SEMICONDUCTOR DEVICES

(75) Inventors: Setsuo Nakajima, Kanagawa (JP);
Hisashi Ohtani, Kanagawa (JP);
Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 168 days.

(21) Appl. No.: 10/292,830

(22) Filed: Nov. 12, 2002

(65) Prior Publication Data

US 2003/0096460 A1 May 22, 2003

Related U.S. Application Data

(62) Division of application No. 09/441,025, filed on Nov. 16, 1999, now Pat. No. 6,518,594.

(30) Foreign Application Priority Data

Nov. 16, 1998 (JP) .......................................... 10-325708

(51) Int. Cl.⁷ .......................... H01L 21/00; H01L 21/84
(52) U.S. Cl. ....................... 438/163; 438/151; 438/154; 438/304
(58) Field of Search ................................ 438/151, 154, 438/163, 164, 231, 304, 307

(56) References Cited

U.S. PATENT DOCUMENTS

| | | | |
|---|---|---|---|
| 3,933,529 A | 1/1976 | Goser | 148/1.5 |
| 4,727,038 A | 2/1988 | Watabe et al. | 437/29 |
| 5,247,190 A | 9/1993 | Friend et al. | 257/40 |
| 5,323,042 A | 6/1994 | Matsumoto | 257/350 |
| 5,399,502 A | 3/1995 | Friend et al. | 437/1 |
| 5,594,569 A | 1/1997 | Konuma et al. | 349/122 |
| 5,643,826 A | 7/1997 | Ohtani et al. | 437/88 |
| 5,693,959 A | 12/1997 | Inoue et al. | 257/66 |
| 5,719,588 A | 2/1998 | Johnson | 345/8 |
| 5,912,492 A | 6/1999 | Chang et al. | 257/344 |

(List continued on next page.)

FOREIGN PATENT DOCUMENTS

| | | |
|---|---|---|
| JP | 3-250632 | 11/1991 |
| JP | 4-369271 | 12/1992 |
| JP | 5-102483 | 4/1993 |
| JP | 7-130652 | 5/1995 |
| JP | 8-078329 | 3/1996 |
| JP | 10-092576 | 4/1998 |
| JP | 10-135468 | 5/1998 |
| JP | 10-135469 | 5/1998 |
| JP | 10-247735 | 9/1998 |
| WO | WO 90/13148 | 11/1990 |

OTHER PUBLICATIONS

Inui, S. et al, "Thresholdless Antiferroelectricity in Liquid Crystals and its Application to Displays," J. Mater Chem., vol. 6, No. 4, pp. 671–673, 1996.
Yoshida, T. et al, "A Full–Color Thresholdless Antiferroelectric LCD Exhibiting Wide Viewing Angle with Fast Response Time," SID 97 Digest, pp. 841–844, 1997.

(List continued on next page.)

Primary Examiner—Matthew Smith
Assistant Examiner—Lex H. Malsawma
(74) Attorney, Agent, or Firm—Cook, Alex, McFarron, Manzo, Cummings & Mehler, Ltd.

(57) ABSTRACT

Subjected to obtain a crystalline TFT which simultaneously prevents increase of OFF current and deterioration of ON current. A gate electrode of a crystalline TFT is comprised of a first gate electrode and a second gate electrode formed in contact with the first gate electrode and a gate insulating film. LDD region is formed by using the first gate electrode as a mask, and a source region and a drain region are formed by using the second gate electrode as a mask. By removing a portion of the second gate electrode, a structure in which a region where LDD region and the second gate electrode overlap with a gate insulating film interposed therebetween, and a region where LDD region and the second gate electrode do not overlap, is obtained.

30 Claims, 23 Drawing Sheets

U.S. PATENT DOCUMENTS

| | | | | |
|---|---|---|---|---|
| 5,923,962 | A | | 7/1999 | Ohtani et al. ............... 438/150 |
| 6,078,060 | A | * | 6/2000 | Shibuya et al. ............... 257/66 |
| 6,166,396 | A | | 12/2000 | Yamazaki .................... 257/59 |
| 6,180,957 | B1 | | 1/2001 | Miyasaka et al. ............. 257/57 |
| 6,198,133 | B1 | | 3/2001 | Yamazaki et al. | |
| 6,242,290 | B1 | * | 6/2001 | Nakajima et al. ........... 438/153 |
| 6,281,552 | B1 | | 8/2001 | Kawasaki et al. | |

OTHER PUBLICATIONS

Furue, H. et al, "Characteristics and Driving Scheme of Polymer–Stablized Monostable FLCD Exhibiting Fast Response Time and High Contrast Ratio with Gray–Scale Capability," SID 98 Digest, pp. 782–785, 1998.

Terada, et al, "Half–V Switching Mode FLCD," Proceedings of the 46th Applied Physics Association Lectures, 28p–V–8, p. 1316, Mar., 1999.

Yoshihara, T. et al, "Time Division Full Color LCD by Ferroelectric Liquid Crystal," Ekisho, vol. 3, No. 3, pp. 190–194, 1999.

Hatano, M. et al, "A Novel Self–Aligned Gate–Overlapped LDD Poly–Si TFT with High Reliability and Performance," IEDM 97, pp. 523–526.

Schenk, H. et al, "Polymers for Light Emitting Diodes," EuroDisplay '99, Proceedings of the 19th International Display Research Conference, Berlin, Germany, Sep. 6–9, 1999, pp. 33–37.

English abstract re Japanese patent application No. 7–130652, published May 19, 1995.

English abstract re Japanese patent application No. 8–078329 published Mar. 22, 1996.

English abstract re Japanese patent application No. 10–092576 published Apr. 10, 1998.

English abstract re Japanese patent application No. 10–135468, published May 22, 1998.

English abstract re Japanese patent application No. 10–135469, published May 22, 1998.

English abstract re Japanese patent application No. 10–247735, published Sep. 14, 1998.

U.S. patent application No. 09/432,662 (pending) to Yamazaki et al filed Nov. 3, 1999, including specification, claims, abstract, drawings and PTO filing receipt.

U.S. patent application No. 09/435,154 (pending) to Yamazaki et al filed Nov. 8, 1999, including specification, claims, abstract, drawings and PTO filing receipt.

Definition of 'Overlap' from Webster's II Dictionary, p. 839.

English abstract re Japanese patent application No. JP 3–250632, published Nov. 8, 1991.

Complete English translation of Japanese patent application No. JP 4–369271 published Dec. 22, 1992.

Complete English translation of Japanese patent application No. JP 5–102483 published Apr. 23, 1993.

* cited by examiner

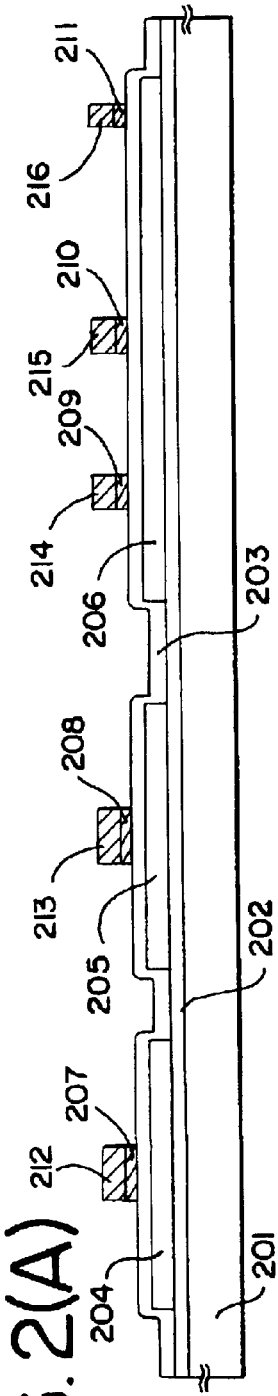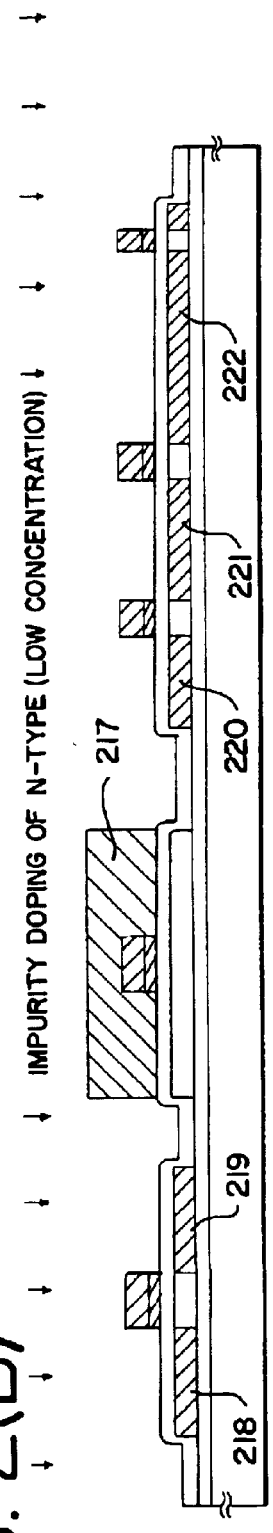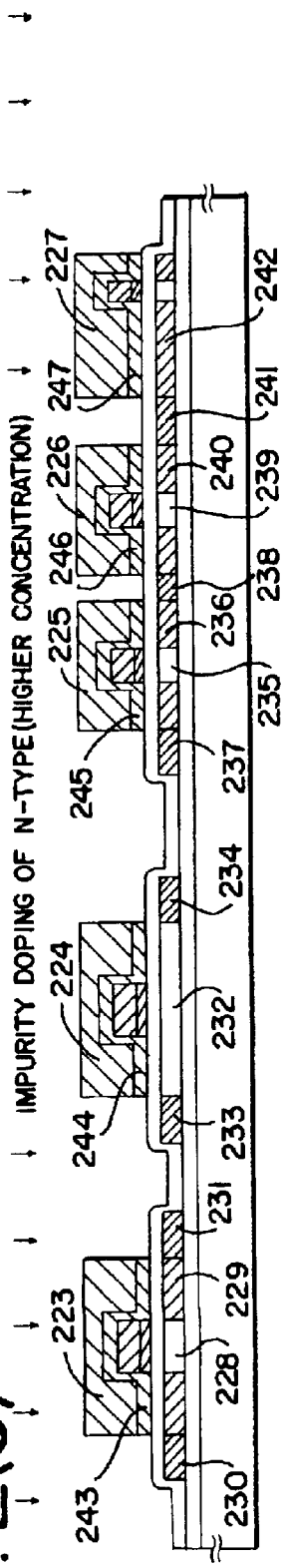

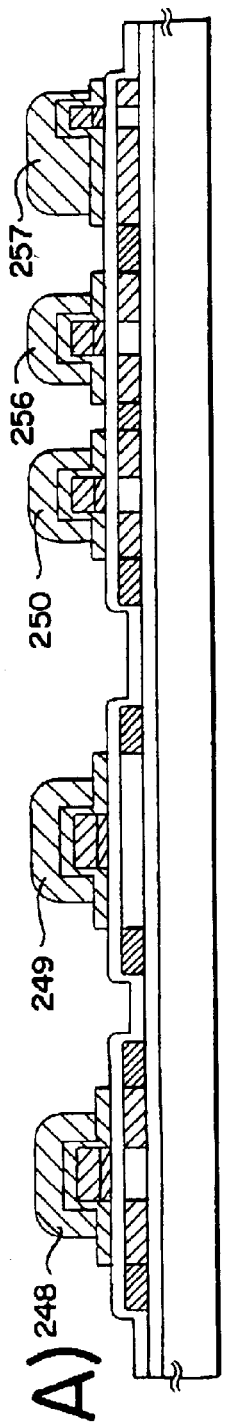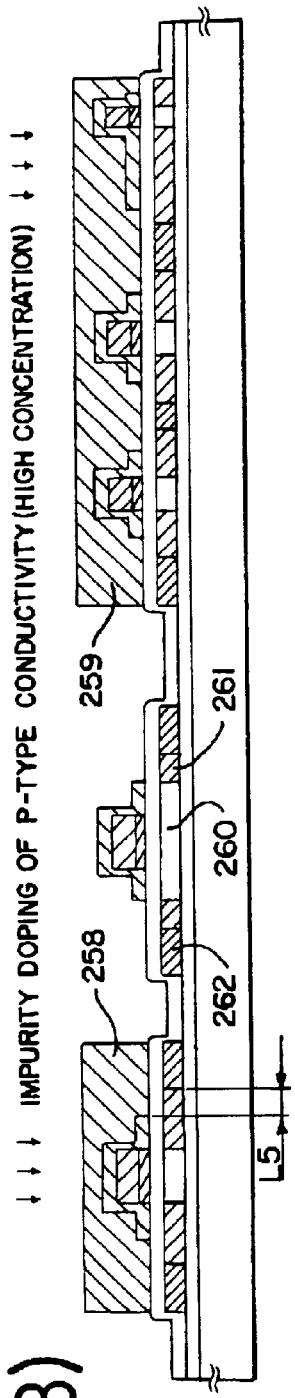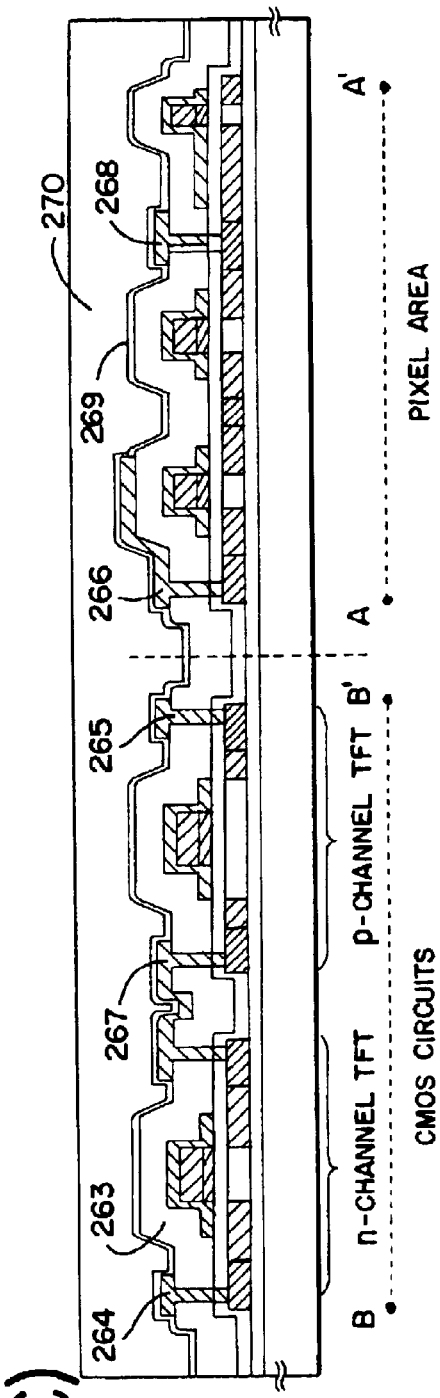

FIG. 7
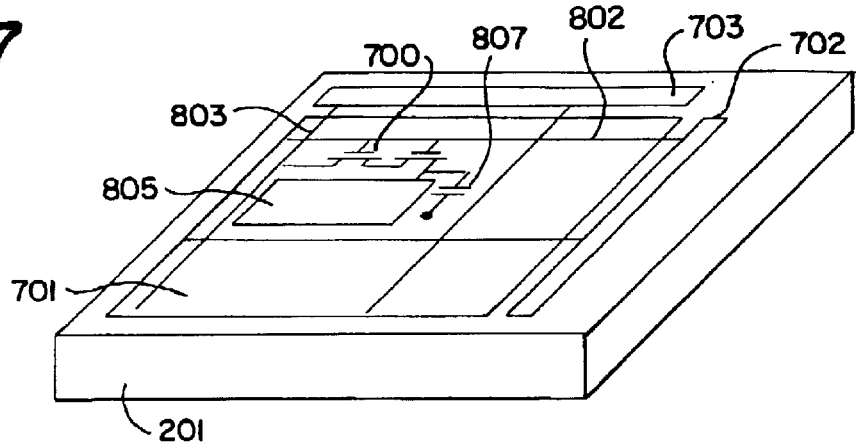
FIG. 8(A) TOP VIEW OF PIXEL MATRIX CIRCUIT
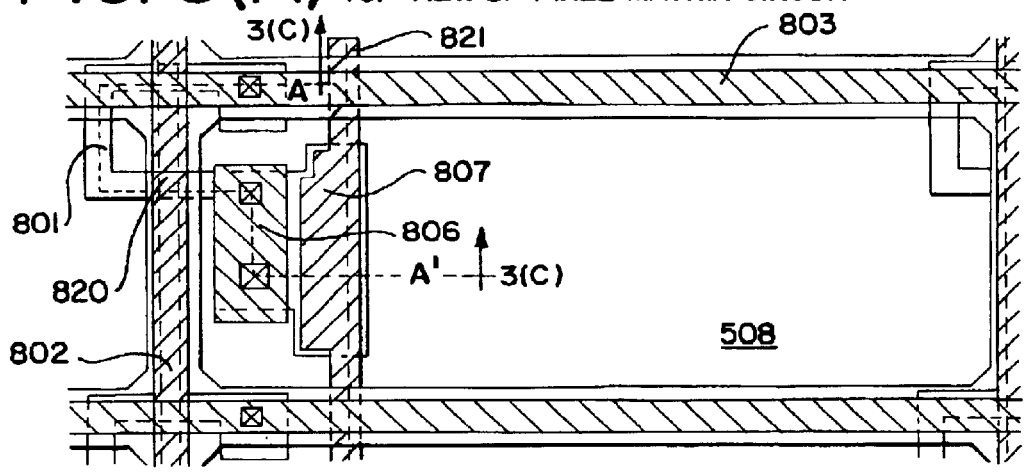
FIG. 8(B) TOP VIEW OF CMOS CIRCUIT
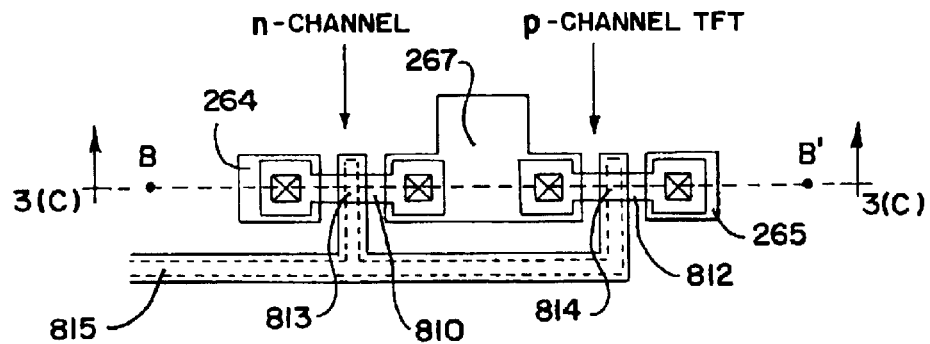

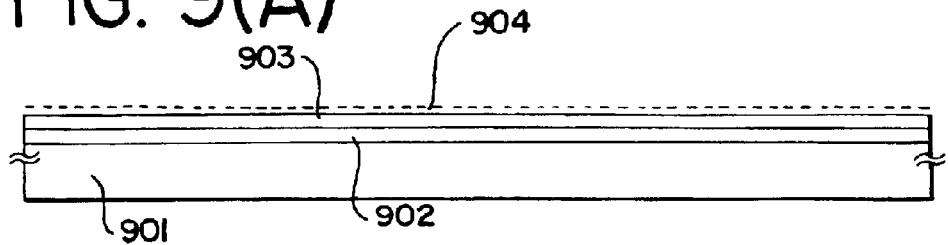
FIG. 9(A)
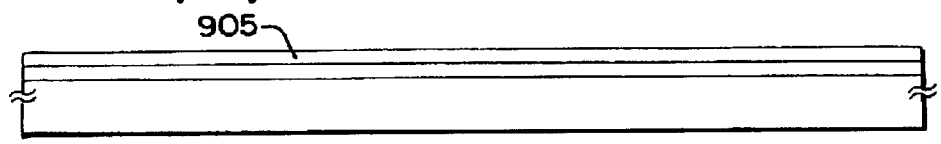
FIG. 9(B) CRYSTALLIZATION PROCESS
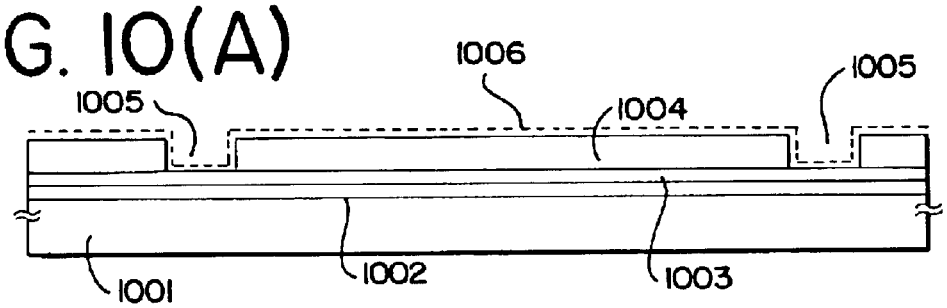
FIG. 10(A)
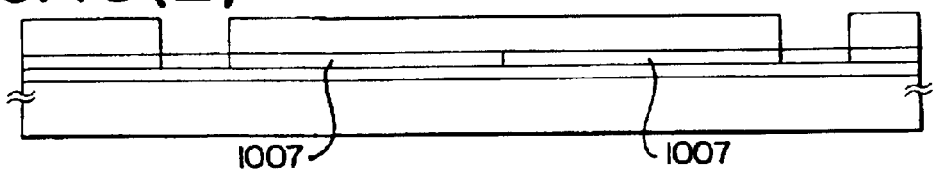
FIG. 10(B) CRYSTALLIZATION PROCESS

HEAT TREATMENT IN AN ATMOSPHERE CONTAINING HALOGEN ELEMENT

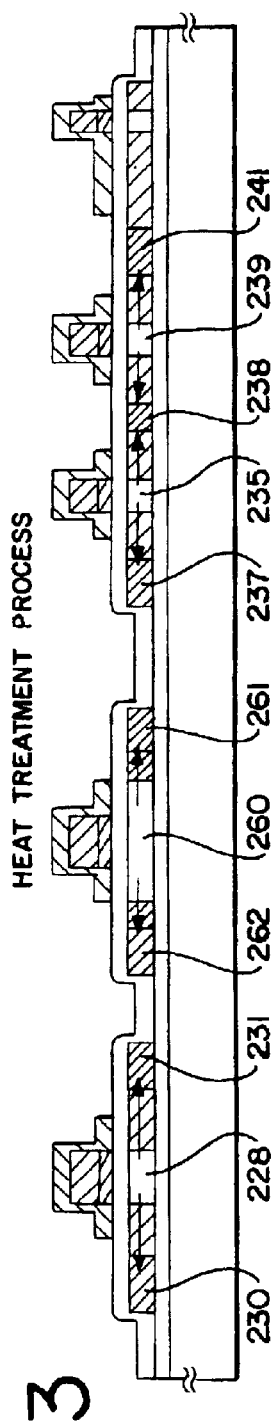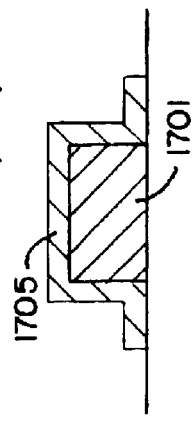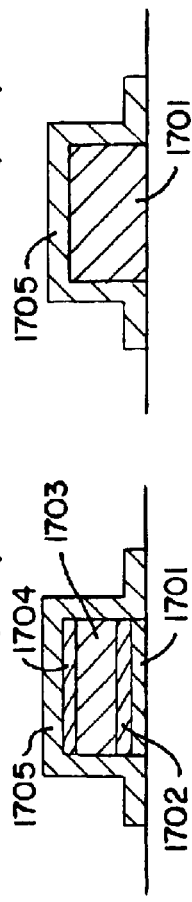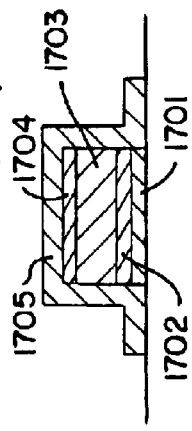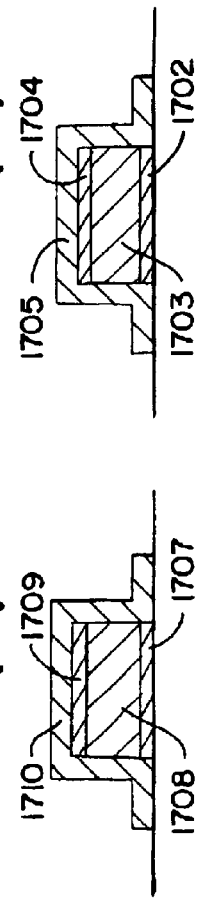

FIG. 17(I-A)
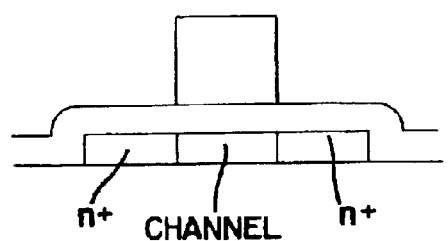
FIG. 17(I-B)
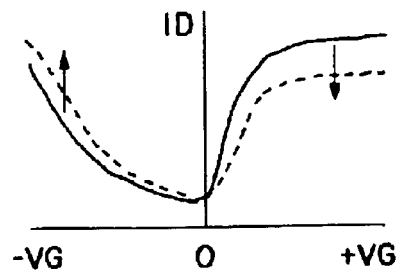
FIG. 17(II-A)
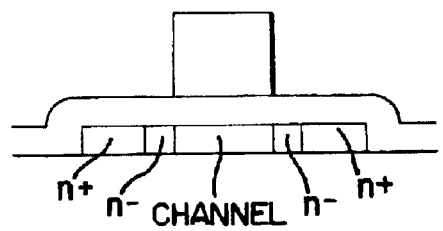
FIG. 17(II-B)
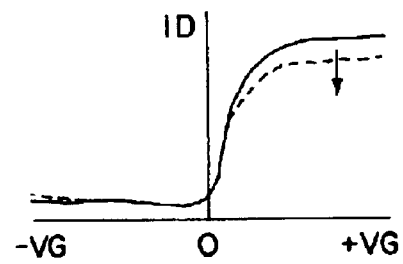
FIG. 17(III-A)
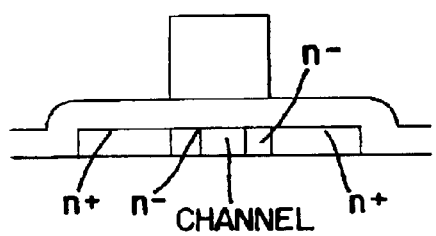
FIG. 17(III-B)
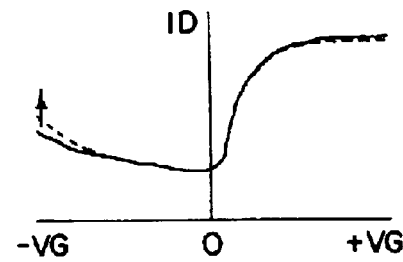
FIG. 17(IV-A)
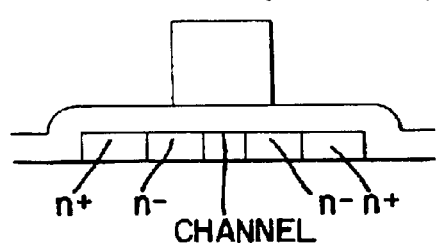
FIG. 17(IV-B)
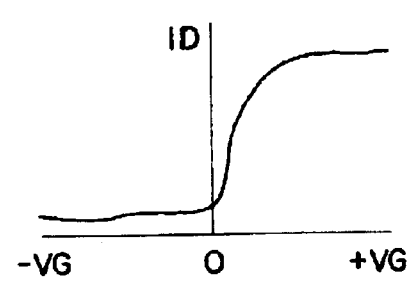

FIG. 21(A) EL PANEL CIRCUIT DIAGRAM
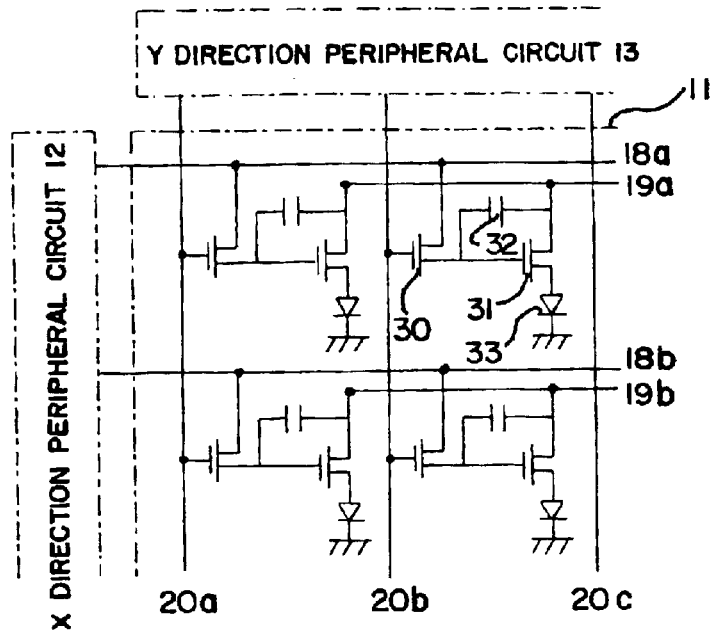
FIG. 21(B) TOP VIEW OF EL PANEL PIXEL
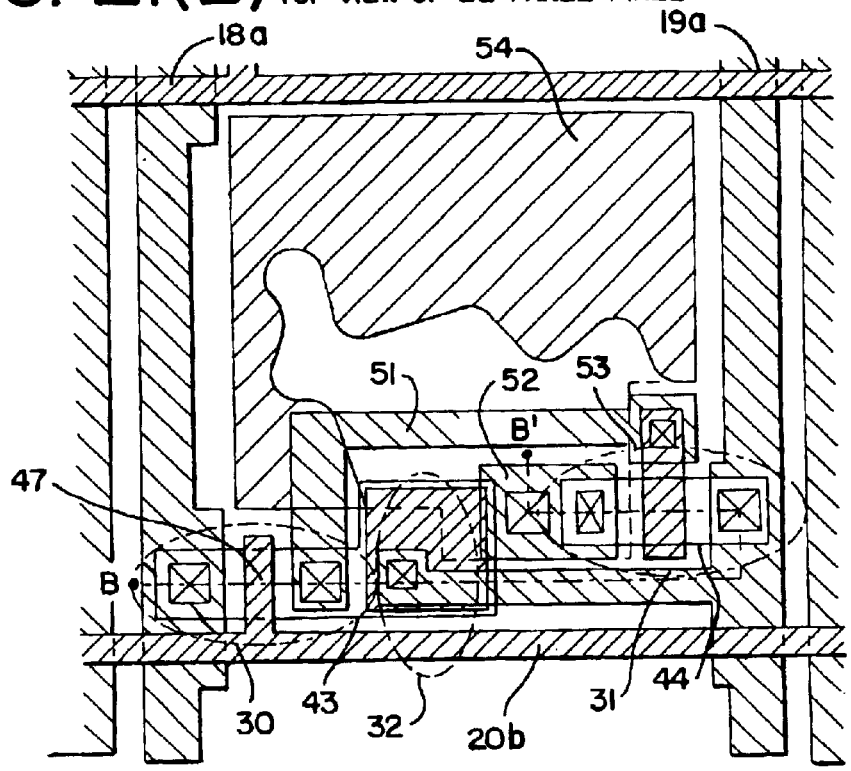

METHOD OF MANUFACTURING SEMICONDUCTOR DEVICES

This application is a divisional of U.S. application Ser. No. 09/441,025, filed Nov. 16, 1999, now U.S. Pat. No. 6,518,594.

BACKGROUND OF THE INVENTION

1. Field of the Invention

The present invention relates to a semiconductor device having a circuit comprising thin-film transistors on a substrate with an insulating surface and to a method of manufacture thereof. More specifically, the invention relates to a constitution of an electrooptical device represented by a liquid crystal display and of an electronic apparatus mounting the electrooptical device. In this specification, the semiconductor device generally denotes devices that function by utilizing semiconductor characteristics and includes the electrooptical devices and the electronic apparatus mounting the electrooptical devices.

2. Related Art

The thin-film transistor (hereinafter abbreviated to TFT) can be fabricated on a transparent glass substrate and therefore has been actively applied to active matrix liquid crystal displays. Because the TFT formed of a semiconductor layer having a crystal constitution (hereinafter referred to as a crystalline TFT) has a high mobility, high resolution image display can be realized by integrating functional circuits on the same substrate.

In this specification, the semiconductor film having the crystal constitution includes a single crystal semiconductor, a polycrystalline semiconductor, and a microcrystal semiconductor. It also includes semiconductors disclosed in official gazettes JP-A 7-130652, JP-A 8-78329, JP-A 10-135468, and JP-A 10-135469.

To construct an active matrix liquid crystal display, the pixel area alone requires 1 to 2 million crystalline TFTs and, when peripheral functional circuits are constitution, additional numbers of crystalline TFTs are necessary. To operate the liquid crystal display stably requires securing reliability of individual crystalline TFTs.

The characteristic of a field-effect transistor such as TFT can be constitution as comprising a linear region where a drain current increases in proportion to a drain voltage, a saturation region where the drain current saturates even if the drain voltage increases, and a cut-off region where the current ideally does not flow even when the drain voltage is applied. In this specification, the linear region and the saturation region are called ON regions of TFT and the cut-off region is called an OFF region. The drain current in the ON region is called an ON current and the current in the OFF region an OFF current.

The pixel area of the active matrix liquid crystal display comprises n-channel TFTs (hereinafter referred to as pixel TFTs) and, because a gate voltage with an amplitude of about 15–20 V is applied thereto, needs to satisfy both of the characteristics of the ON region and the OFF region. On the other hand, the peripheral circuits for driving the pixel area basically comprise CMOS circuits and their characteristics of the ON regions are mainly important. The crystalline TFTs, however, have a problem that the OFF current easily increases. Further, a degradation phenomenon has often been observed when driving the crystalline TFT for an extended period of time results in the mobility and ON current decrease and the OFF current increases. One of the possible causes is presumed to be a hot carrier injection phenomenon caused by a high electric field near the drain.

In the field of the MOS transistor, a lightly doped drain (LDD) constitution has been known as a method for reducing the OFF current and alleviating the high electric field near the drain. This constitution has a low concentration impurity region on the inner side of the source and drain regions, i.e., on the side of the channel forming region. This low concentration impurity region is called an LDD region.

The LDD constitution is also known to be formed similarly in the crystalline TFT. For example, with the gate electrode as a mask, a first impurity injection process forms a low concentration impurity region that will form an LDD region, and then sidewalls are formed on both sides of the gate electrode by using an anisotropic etching technique. With the gate electrode and the sidewalls as a mask, a second impurity injection process forms a high concentration impurity region that will form a source region and a drain region.

Although the LDD constitution can render the OFF current lower as compared with that of the ordinary constitution TFT, the LDD constitution has a drawback that because a series resistance component increases for the constitution reason, the TFT ON current, too, is reduced. Further, the deterioration of the ON current cannot be prevented completely. To compensate for this drawback a constitution has been known to be used in which the LDD region overlaps the gate electrode with the gate insulating film interposed therebetween. There are several methods for making this constitution, such as GOLD (Gate-drain Overlapped LDD) and LATID (Large-tilt-angle implanted drain). In this overlapping constitution the high electric field near the drain can be alleviated to increase the tolerance for hot carriers and at the same time prevent reduction in the ON current.

It is also confirmed that in the crystalline TFT, too, the provision of the LDD constitution increases withstandability against hot carriers as compared with that of the simple constitution TFT having only the source region, drain region and channel forming region, and that the use of the GOLD constitution produces an excellent effect. This fact is described in "A Novel Self-aligned Gate-overlapped LDD Poly-Si TFT with High Reliability and Performance," by Mutsuko Hatano, Hajime Akimoto and Takeshi Sakai, IEDM97-523.

In the crystalline TFT, forming the LDD constitution has proved to be an effective means for suppressing the hot carrier injection phenomenon. Further, the use of the GOLD constitution is found to be able to prevent a reduction in the ON current, which was observed in the LDD constitution, and also to produce a preferable result in terms of reliability.

Although the GOLD constitution can prevent degradation of the ON current, it has a drawback that when a high gate voltage is applied thereto at the OFF characteristic, the OFF current is increased, as observed in the pixel TFT in particular. An increase in the OFF current in the pixel TFT produces undesired effects such as increased power consumption and abnormal image display. This is constitution due to an inverted layer which, because of the characteristic of the OFF region, is formed in the LDD region overlapping the gate electrode.

As described above, to realize a high level of reliability in the crystalline TFT requires a comprehensive study on the constitution of the device. For this reason, it has been desired that the GOLD constitution be formed. With the conventional method, however, although the LDD region can be formed self-aligningly, the process of forming the sidewall film by an anisotropic etching is not suited for processing a large-area glass substrate like the one used in the liquid crystal display. Further, because the length of the LDD region is determined by the width of the sidewall, the degree of freedom in designing device dimensions is severely restricted.

If, as in the pixel TFT, the characteristics of both the ON region and the OFF region are important and an attempt is made to meet the required level of their reliability and prevent an increase in the OFF current, the conventional GOLD constitution is not sufficient.

SUMMARY OF THE INVENTION

A first object of the invention is to provide a crystalline TFT having a constitution in which a gate electrode and an LDD region are overlapped by a simpler method than conventional ones, and to provide a method of manufacturing such a crystalline TFT. The GOLD constitution has a problem that when a high gate voltage is applied thereto at the OFF characteristic, the OFF current is increased. It is therefore a second object of the invention to provide a constitution capable of preventing an increase in the OFF current and a method of manufacturing such a constitution.

For a pixel area of the liquid crystal display and drive circuits made basically of CMOS circuits arranged around the pixel area, it is a third object of the invention to provide a constitution in which the LDD region of at least an n-channel TFT overlaps a gate electrode and which can prevent an increase in the OFF current, and to provide a method of manufacturing the constitution.

FIG. 17 schematically shows the constitution of a TFT and its Vg-Id (gate voltage-drain current) characteristic, based on the findings obtained so far. FIG. 17(A-1) shows the simplest constitution of TFT in which the semiconductor layer comprises a channel forming region, a source region and a drain region. In the characteristic shown in FIG. 17(B-1), +Vg side represent the ON region of TFT and −Vg side an OFF region. A solid line represents an initial characteristic and a dashed line a characteristic after application of a bias stress. In this constitution, the ON current and the OFF current are both high and the degradation due to the bias stress is large, so that this constitution cannot be applied to the pixel TFT.

FIG. 17(A-2) shows a constitution in which a low concentration impurity region that will make an LDD region is added to the (A-1) constitution in such a way that the gate electrode does not overlap the LDD region. In this constitution, although it is possible to suppress the OFF current to some extent, the degradation of the ON current cannot be prevented, as shown in (B-2). FIG. 17(A-3) shows a constitution, also called a GOLD constitution, in which the LDD region completely overlaps the gate electrode. As shown in (B-3), the degradation of the ON current can be suppressed but there is a problem that the OFF current is higher than that of the (A-2) LDD constitution.

Hence, the constitution shown in FIGS. 17(A-1), (A-2), and (A-3) cannot simultaneously satisfy both of the ON region characteristic and the OFF region characteristic required by the pixel area, within the reliability requirement. It has been found, however, that the use of the constitution of FIG. 17(A-4) can prevent deterioration of the ON current and suppress an increase in the OFF current. This can be achieved by dividing the LDD region into a region that overlaps the gate electrode and a region that does not. The LDD region overlapping the gate electrode has a function of suppressing a hot carrier injection phenomenon and the LDD region not overlapping the gate electrode has a function of preventing an increase in the OFF current.

In the present invention, a gate electrode is formed of a plurality of layers in order to obtain a constitution in which the LDD region overlaps the gate electrode, by a step of forming a first conductive layer of the gate electrode and a step of forming a second conductive layer of the gate electrode. After the first conductive layer forming step, the invention performs a step of first impurity element doping to form a first impurity region that will make the LDD region and, after the second conductive layer forming step, performs a step of a second impurity element doping to form a second impurity region that will make a source region and a drain region. Then, a part of the second conductive layer is removed to form a TFT which has a region where the LDD region does not overlap the second conductive layer.

Therefore, the constitution of this invention disclosed in this specification is characterized in that, in a semiconductor device having a pixel area where an n-channel thin-film transistor is provided in each pixel, the gate electrode of the n-channel thin-film transistor has a first conductive layer formed in contact with a gate insulating film and a second conductive layer formed in contact with the first conductive layer and the gate insulating film; and that the semiconductor layer of the n-channel thin-film transistor has a channel forming region, a first impurity region of one conductivity type formed in contact with the channel forming region, and a second impurity region of one conductivity type formed in contact with the first impurity region, the first impurity region having a part thereof overlapping a region of the second conductive layer that is in contact with the gate insulating film.

Another constitution of this invention is characterized in that, in a semiconductor device including a CMOS circuit having an n-channel thin-film transistor and a p-channel thin-film transistor, the gate electrode of the n-channel thin-film transistor has a first conductive layer formed in contact with a gate insulating film and a second conductive layer formed in contact with the first conductive layer and the gate insulating film; and that the semiconductor layer of the n-channel thin-film transistor has a channel forming region, a first impurity region of one conductivity type formed in contact with the channel forming region, and a second impurity region of one conductivity type formed in contact with the first impurity region, the first impurity region having a part thereof overlapping a region of the second conductive layer that is in contact with the gate insulating film.

Still another constitution of this invention is characterized in that, in a semiconductor device which includes a pixel area where an n-channel thin-film transistor is provided in each pixel and a CMOS circuit having an n-channel thin-film transistor and a p-channel thin-film transistor, the gate electrode of the n-channel thin-film transistor has a first conductive layer formed in contact with a gate insulating film and a second conductive layer formed in contact with the first conductive layer and the gate insulating film; and that the semiconductor layer of the n-channel thin-film transistor has a channel forming region, a first impurity region of one conductivity type formed in contact with the channel forming region, and a second impurity region of one conductivity type formed in contact with the first impurity region, the first impurity region having a part thereof overlapping a region of the second conductive layer that is in contact with the gate insulating film.

In the constitution of this invention described above, the first impurity region forms the LDD region and the second impurity region forms the source region or drain region. The gate electrode of the p-channel thin-film transistor comprises a first conductive layer formed in contact with a gate insulating film and a second conductive layer formed in contact with the first conductive layer and the gate insulating film. The semiconductor layer of the p-channel thin-film transistor comprises a channel forming region and a third impurity region of a conductivity type reverse to one conductivity type formed in contact with the channel forming region.

The constitution of this invention described above may comprise a semiconductor layer and a storage capacitance, wherein the semiconductor layer is provided in contact with the second impurity region and has the same conductivity type as the first impurity region, and wherein the storage capacitance is provided by a capacitive line formed by the gate insulating film, the first conductive layer and the second conductive layer.

In the constitution of this invention, the first conductive layer is formed of one of elements selected from titanium (Ti), tantalum (Ta), Tungsten (W) and Molybdenum (Mo), or an alloy made mainly of these elements.

The first conductive layer comprises a conductive layer (A) formed in contact with the gate insulating film and one or more conductive layers formed over the conductive layer (A). It is preferred that the conductive layer (A) formed in contact with the gate insulating film be formed of one element selected from titanium (Ti), tantalum (Ta), tungsten (W) and molybdenum (Mo), or formed of an alloy made mainly of these elements, and that at least one of the one or more conductive layers formed over the conductive layer (A) be formed of one element selected from aluminum (Al) and copper (Cu) or formed of an alloy made mainly of these elements. The second conductive layer should preferably be formed of one element selected from titanium (Ti), tantalum (Ta), tungsten (W) and molybdenum (Mo), or formed of an alloy made mainly of these elements.

To realize the constitution described above, the method of manufacturing a semiconductor device according to the invention comprises: a first step of forming a semiconductor layer over a substrate having an insulating surface; a second step of forming a gate insulating film in contact with the semiconductor layer; a third step of forming a first conductive layer in contact with the gate insulating film; a fourth step of forming a first impurity region by adding an element belonging to Group 15 in the periodic table to the semiconductor layer with the first conductive layer as a mask; a fifth step of forming a second conductive layer in contact with the first conductive layer and the gate insulating film; a sixth step of forming a second impurity region by adding an element belonging to Group 15 in the periodic table to the semiconductor layer with the second conductive layer as a mask; and a seventh step of removing a part of the second conductive layer.

Another manufacturing method of the invention comprises: a first step of forming a first semiconductor layer and a second semiconductor layer over a substrate having an insulating surface; a second step of forming a gate insulating film in contact with the first semiconductor layer and the second semiconductor layer; a third step of forming a first conductive layer in contact with the gate insulating film; a fourth step of forming a first impurity region by adding an element belonging to Group 15 in the periodic table to at least the first semiconductor layer with the first conductive layer as a mask; a fifth step of forming a second conductive layer in contact with the first conductive layer and the gate insulating film; a sixth step of forming a second impurity region by adding an element belonging to Group 15 in the periodic table to at least the first semiconductor layer with the second conductive layer as a mask; and a seventh step of forming a third impurity region by adding an element belonging to Group 13 in the periodic table to only the second semiconductor layer with the second conductive layer as a mask.

Still another manufacturing method of the invention comprises: a first step of forming a first semiconductor layer and a second semiconductor layer over a substrate having an insulating surface; a second step of forming a gate insulating film in contact with the first semiconductor layer and the second semiconductor layer; a third step of forming a first conductive layer in contact with the gate insulating film; a fourth step of forming a first impurity region by adding an element belonging to Group 15 in the periodic table to at least the first semiconductor layer with the first conductive layer as a mask; a fifth step of forming a second conductive layer in contact with the first conductive layer and the gate insulating film; a sixth step of forming a second impurity region by adding an element belonging to Group 15 in the periodic table to at least the first semiconductor layer with the second conductive layer as a mask; a seventh step of removing a part of the second conductive layer; and an eighth step of forming a third impurity region by adding an element belonging to Group 13 in the periodic table to only the second semiconductor layer with the second conductive layer as a mask.

The manufacturing method of the invention described above is characterized in that the first impurity region forms the LDD region and the second impurity region forms a source region and a drain region. The manufacturing method further includes: a step of adding an element belonging to Group 15 in the periodic table in the same concentration as in the first impurity region to a semiconductor layer extending from the second impurity region; and a step of forming a capacitive line by the first conductive layer and the second conductive layer.

In the constitution of this invention, the first conductive layer is formed of one element selected from titanium (Ti), tantalum (Ta), tungsten (W) and molybdenum (Mo), or formed of an alloy made mainly of these elements.

The invention is further characterized in that the first conductive layer comprises a conductive layer (A) formed in contact with the gate insulating film and one or more conductive layers formed over the conductive layer (A); that the conductive layer (A) is formed of one element chosen from titanium (Ti), tantalum (Ta), tungsten (W) and molybdenum (Mo), or formed of an alloy made mainly of these elements; that at least one of the conductive layers formed over the conductive layer (A) is formed of one element chosen from aluminum (Al) and copper (Cu) or formed of an alloy made mainly of these elements; and that the second conductive layer is formed of one element selected from titanium (Ti), tantalum (Ta), tungsten (W) and molybdenum (Mo), or formed of an alloy made mainly of these elements.

BRIEF DESCRIPTION OF THE DRAWINGS

FIG. 2 is a cross sectional view showing a process of manufacturing the TFT.

FIG. 3 is a cross sectional view showing a process of manufacturing the TFT.

FIG. 7 is a perspective view of an active matrix substrate.

FIG. 8 is a top view of a pixel area and CMOS circuits.

FIG. 9 is a schematic diagram showing a process of manufacturing a crystalline silicon film.

FIG. 10 is a schematic diagram showing a process of manufacturing a crystalline silicon film.

FIG. 13 is a cross sectional view showing a process of manufacturing a TFT.

FIG. 14 is a cross sectional view showing a constitution of a gate electrode.

FIG. 17 is a diagram showing a TFT constitution and an electric characteristic.

FIG. 21 is a schematic diagram showing the constitution of an active matrix EL display.

DETAILED DESCRIPTION OF THE INVENTION

One representative example of the invention will be described by referring to FIG. 1. Reference number 101 represents a substrate with an insulating surface. It may be, for example, a glass substrate, stainless steel substrate, plastic substrate, ceramic substrate and silicon substrate, all with a silicon oxide film. A quartz substrate may also be used.

The surface of the substrate 101 over which a TFT is to be formed is deposited with a base film 102. The base film 102 is formed of a silicon oxide film or silicon nitride film to prevent an impurity from diffusing from the substrate 101 into a semiconductor layer. The base film 102 may also be formed of a silicon oxynitride film.

The semiconductor layer formed over the substrate should preferably be formed of a crystalline semiconductor, which is made by crystallizing, through a laser crystallization method or a solid phase epitaxy by heat treatment, an amorphous semiconductor deposited through plasma CVD, low pressure CVD or sputtering. It is also possible to use a microcrystalline semiconductor formed by the method described above. The semiconductor material that can be used here includes silicon, germanium, silicon-germanium alloy, and silicon carbide. A semiconductor compound material such as gallium arsenide may also be used.

Alternatively, the semiconductor layer formed over the substrate 101 may be an SOI (Silicon On Insulators) substrate with a single crystal silicon layer. There are several kinds of SOI substrates according to the constitution and the manufacturing method. Typically SIMOX (Separation by Implanted Oxygen), ELTRAN (Epitaxial Layer Transfer: trade name of Canon) substrate, Smart-Cut (trade name of SOITEC) may be used. Other SOI substrates may of course be used.

Figure 1:
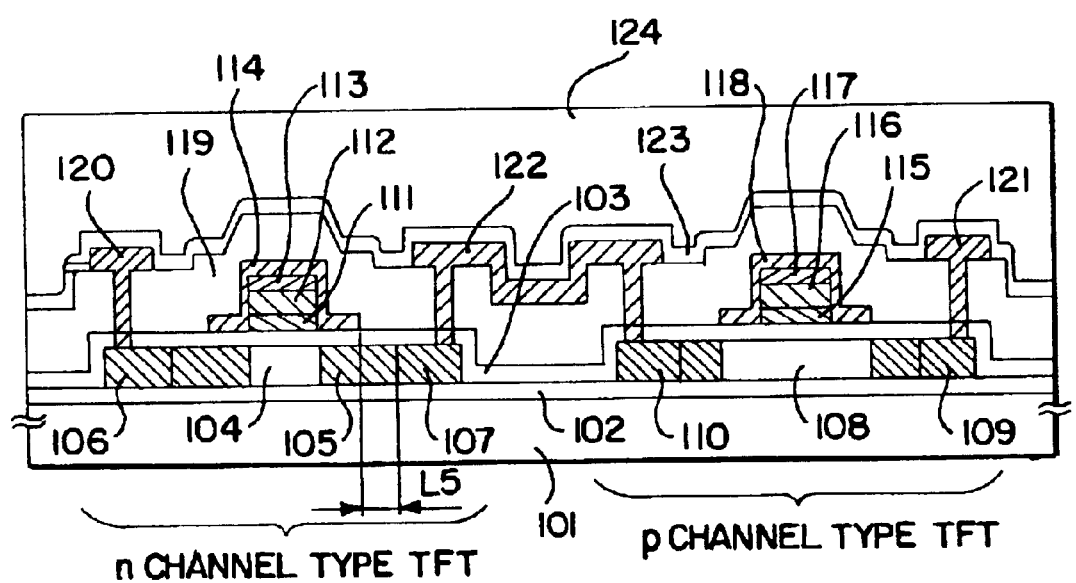
FIG. 1 is a cross sectional view of a TFT according to one embodiment of the invention.

FIG. 1 shows cross-sectional constitution of n-channel and p-channel TFTs. The gate electrodes of the n- and p-channel TFTs comprise a first conductive layer and a second conductive layer. In FIG. 1, the first conductive layer is of a 3-layer constitution, comprising a conductive layer (A), 111, 115 formed in contact with a gate insulating layer 103, and a conductive layer (B) 112, 116 and a conductive layer (C) 113, 117 deposited over the conductive layer (A). The second conductive layer 114, 118 is formed in contact with the upper and side surfaces of the first conductive layer and extends over the gate insulating layer 103.

The conductive layer (A) 111, 115 which comprise the first conductive layer is made of Ti, Ta, Mo and W or an alloy consisting mainly of these elements. The conductive layer (B) 112, 116 is preferably made of Al and Cu with a low resistivity. The conductive layer (C) 113, 117 is made of Ti, Ta, Mo and W or an alloy consisting mainly of these elements, as with the conductive layer (A). The conductive layer (B) is provided for the purpose of reducing the resistance of the gate electrode, constitution a situation where the TFT of this invention is formed on a large-area substrate like a liquid crystal display. Depending on the use, the first conductive layer may be formed of the conductive layer (A) only or of three or more layers deposited one upon the other.

Figure 16:
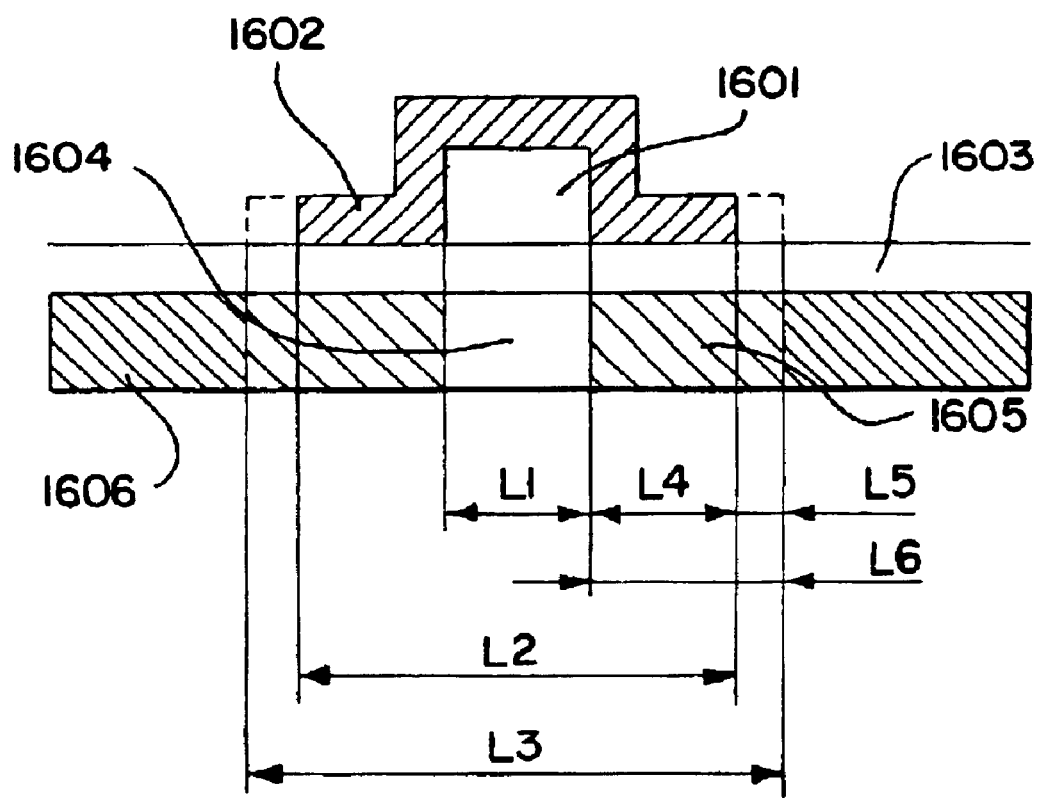
FIG. 16 is a schematic diagram showing the constitution of a-gate electrode.

The second conductive layer 114, 118 is electrically conductive to the first conductive layer and extends over the gate insulating layer 103. FIG. 16 shows a detailed constitution of the gate electrode. The second conductive layer is initially formed over a length of L3 and is etched away by a length of L5 to have the final length of L2. Hence, if the first conductive layer has a length of L1, the distance over which the second conductive layer extends over the gate insulating layer 103 can be expressed as L4.

In this invention, the gate electrodes should preferably be formed so that L1 is 0.1 to 10 $\mu$m and L3 0.5 to 22 $\mu$m. The distance L5 by which the second conductive layer is etched away needs to be 0.1 to 3 $\mu$m. Hence, L2 is 0.3 to 16 $\mu$m and L4 0.1 to 3 $\mu$m.

The first conductive layer and the second conductive layer also have a function of mask in the first impurity doping process and the second impurity doping process. This fact should be taken into account in determining the lengths of L1 and L3 and of L2 and L5. As shown in FIG. 16, the reason for forming the second conductive layer at first over the length L3 and then etching away by the length L5 to have the final length of L2 is to ensure that the area in which the first impurity region 1605 that will make the LDD region contacts the second gate insulating film through the gate insulating film has the length of L4 and the area in which it does not contact the second gate insulating film has the length of L5 in order to realize the constitution of this invention.

In the case where this invention is applied to the pixel area, to realize a practical aperture ratio requires using a low resistance material with a thin film resistivity of 2–3 $\mu\Omega\cdot$cm for the gate electrode, and thus Al and Cu should preferably be used. Constitution heat resistance, the gate electrode should preferably have a clad constitution in which the conductive layer (B) of a low resistance material is enclosed by the conductive layer (A) or (C) of the first conductive layer of the gate electrode which is made of a high melting point metal such as Ta, W and Mo or their alloy and further enclosed by the second conductive layer.

The semiconductor layer of the n-channel TFT comprises: a channel forming region 104; a first impurity region 105 formed in contact with the channel forming region; and a source region 106 and a drain region 107, both formed in contact with the first impurity region 105. The first impurity region 105 is formed to overlap the second conductive layer 114 with the gate insulating layer 103 interposed therebetween.

The first impurity region 105 has an n-type impurity element concentration of $1\times10^{16}$ to $1\times10^{19}$ atoms/cm$^3$, typically $1\times10^{17}$ to $5\times10^{18}$ atoms/cm$^3$. The source region 106 and the drain region 107 have an impurity concentration of $1\times10^{20}$ to $1\times10^{21}$ atoms/cm$^3$, typically $1\times10^{20}$ to $5\times10^{20}$ atoms/cm$^3$.

At this time, the channel forming region 104 may be injected with boron in a concentration of $1\times10^{16}$ to $5\times10^{18}$ atoms/cm$^3$ in advance. Boron is added in order to control a threshold voltage and any other elements can be used if they can produce the similar effect.

Third impurity regions 109, 110 of p-channel TFT are used to form a source region and a drain region. The third impurity regions 109, 110 contain an n-type impurity element at the same concentration level as the source region 106 and the drain region 107 of the n-channel TFT and are also doped with a p-type impurity element in a concentration 1.5 to 3 times that of the n-type impurity element. The third impurity regions 109, 110 are formed outside the second conductive layer 118 of the gate electrode.

As described above, the TFT of this invention has a constitution in which the gate electrode comprises the first conductive layer and the second conductive layer with the second conductive layer formed in contact with the first conductive layer and the gate insulating film, as shown in FIG. 1. The TFT of the invention is also characterized in that, in at least the n-channel TFT, a part of the first impurity region formed in the semiconductor layer with the gate insulating film interposed therebetween overlaps the second conductive layer.

The constitution shown in FIG. 1 can be realized by forming the first impurity region that will make the LDD region with the first conductive layer as a mask, and a second impurity region that will make the source and drain regions, with the second conductive layer as a mask, and then etching back the second conductive layer. Hence, the length of the LDD region is determined by the length L1 of the first conductive layer and the length L3 of the second conductive layer, and the length over which the LDD region does not overlap the second conductive layer can be arbitrarily determined by the length L5 by which the second conductive layer is etched back. This method is very effective because it can broaden the degree of freedom in the design and manufacture of TFT.

The p-channel TFT is formed with the third impurity regions 109, 110 but no region for LDD constitution. The third impurity region forms a source region 109 and a drain region 110. Although the LDD constitution of this invention may be provided, it is preferred that a characteristic balance between the p-channel TFT and the n-channel TFT be achieved by gaining the ON current because the p-channel TFT inherently has high reliability. When this invention is applied to the CMOS circuit as shown in FIG. 1, this characteristic balance matters very much. It is also noted that the constitution of this invention can be applied to the p-channel TFT without any problem.

After the n-channel TFT and p-channel TFT are completed as described above, they are covered with a first interlayer insulating film 119 and formed with source lines 120, 121 and a drain line 122. The source and drain lines are connected to the second and third impurity regions through contact holes formed in the first interlayer insulating film. In the constitution of FIG. 1, after these lines are formed, they are covered with a silicon nitride film as a passivation film 123 and further with a second interlayer insulation film 124 of organic resin material. The second interlayer insulation film 124 is not limited to the organic resin material but, when applied to a liquid crystal display, it should preferably use the organic resin material to secure a planar surface.

While FIG. 1 shows an example of a CMOS circuit having an n-channel TFT and a p-channel TFT in a complementary combination, it is also possible to apply this invention to an NMOS circuit comprising an n-channel TFT or to the pixel area of a liquid crystal display.

The constitution of this invention described above will be explained in more detail in conjunction with the following examples.

EXAMPLE 1

This example describes a constitution of this invention, a method of manufacturing simultaneously a pixel area and CMOS circuits that are basic configuration of driving circuits provided around the pixel area.

In FIG. 2, a substrate 201 is an alkali-free glass substrate, represented, for example, by 1737 glass substrate of Corning make. The surface of the substrate 201 where the TFT is to be formed is deposited with a base film 202 made mainly of silicon oxide to a thickness of 200 nm. The base film 202 may use a silicon nitride film or silicon oxynitride film.

The base film 202 may be formed in a single layer of the material above or in two or more layers. In either case, it is formed to a thickness of about 100 to 300 nm. For example, the base film 202 may be formed by a plasma CVD method as a two-layer constitution, in which a first silicon oxynitride film is formed from SiH$_4$, NH, and N$_2$O to a thickness of 10 to 100 nm and a second silicon oxynitride film from SiH$_4$ and N$_2$O to a thickness of 100 to 200 nm.

Next, over this base film 202 an amorphous silicon film is deposited by a plasma CVD method to a thickness of 50 nm. The amorphous silicon film should preferably be heated at 400 to 500° C. for dehydrogenation depending on the amount of hydrogen contained to keep the hydrogen content at 5 atm % or less to ensure a desirable condition for crystallization.

The process of crystallizing the amorphous silicon film can use a known laser crystallization technique or a thermal crystallization technique. In this example, a crystalline silicon film was obtained by focusing a KrF excimer laser beam of pulse oscillation type into a linear beam and applying it to the amorphous silicon film.

While this example uses an amorphous silicon film as the initial film, it is also possible to use a microcrystal silicon film as the initial film or directly form a silicon film having crystallinity.

The crystalline silicon film thus formed is patterned to form island semiconductor layers 204, 205, 206.

Next, the semiconductor layers 204, 205, 206 are covered with a gate insulating film 203 made mainly of silicon oxide or silicon nitride. Here a silicon oxynitride film was deposited by a plasma CVD method to a thickness of 100 nm. Then, though not shown, the surface of the gate insulating film 203 is sputtered with Ta to a thickness of 10 to 200 nm, for example 50 nm, for a conductive layer (A) and further with Al to a thickness of 100 to 1,000 nm, for example, 200 nm, for a conductive layer (B), these conductive layers (A) and (B) together comprise the first conductive layer of the gate electrode. Then, a known patterning technique is used to form the conductive layers (A) 207, 208, 209 and 210 and the conductive layers (B) 212, 213, 214 and 215. At this time, as shown in FIG. 16, the length L1 of the first conductive layer of the gate electrode can be set arbitrarily in the range of 0.1 to 10 µm. Here the first conductive layer was patterned with L1 set to 2 µm.

When Al is used for the conductive layer (B) making up the first conductive layer, pure Al may be used or Al alloy may be used which contains 0.1 to 5 atm % of one of elements Ti, Si and Sc. When copper is used, it is preferred that, though not shown, a silicon nitride film be deposited over the surface of the gate insulating film 203 to a thickness of 30 to 100 nm.

In FIG. 2, a storage capacitance is provided on the drain side of the n-channel TFT making up the pixel area. Line electrodes 211, 216 of storage capacitance are formed of the same material as the first conductive layer.

With the constitution of FIG. 2(A) completed in this way, a first process of adding an n-type impurity is performed to form a first impurity region. Impurity elements known to give an n type conductivity to the crystalline semiconductor material include phosphorus (P), arsenic (As) and antimony (Sb). Here phosphorus was used and an ion doping method using phosphine ($PH_3$) was performed. In this process the acceleration voltage was set at a relatively high level of 80 keV to inject phosphorus through the gate insulating film 203 into the semiconductor layer below. The impurity region thus formed will make first impurity regions 229, 236 and 240 of n-channel TFT described later which function as the LDD regions. Hence, the phosphorus concentration in these regions is preferably set in the range of $1\times10^{16}$ to $1\times10^{19}$ atoms/cm$^3$. Here $1\times10^{18}$ atoms/cm$^3$ was used (FIG. 2(B)).

The impurity elements described above which were doped in the semiconductor layer had to be activated by laser annealing or heat treatment. This process may be performed after the impurity doping process for forming the source and drain regions. It was, however, effective to activate the impurity elements at this stage by the laser annealing.

In this process, the conductive layers (A) 207, 208, 209 and 210 and the conductive layers (B) 212, 213, 214 and 215, those comprise the first conductive layer, function as a mask for the injection of phosphorus. As a result, no or almost no phosphorus was injected in areas immediately below the first conductive layer, with the gate insulating film interposed therebetween. Then, as shown in FIG. 2(B), impurity regions 218, 219, 220, 221 and 222 doped with phosphorus were formed. In this process, a resist mask 217 was formed to prevent the semiconductor layer 205 of p-channel TFT forming the CMOS circuit from being injected with phosphorus.

After the resist mask 217 was removed, the second conductive layer of the gate electrode was formed. Here, Ta was used as a material for the second conductive layer and deposited to a thickness of 100 to 1,000 nm, for example 200 nm. It was then patterned by a known technique to form the second conductive layers 243, 244, 245 and 246. At this time, the length L3 of the second conductive layer (corresponding to the length represented by the same reference number in FIG. 16) was set in the range of 0.5 to 22 µm. Here it was patterned so that the length was 5 µm. As a result, the second conductive layer has, on both sides of the first conductive layer, regions (L6) 1.5 µm long each over which it contacts the gate insulating film.

A storage capacitance is provided on the drain side of the pixel TFT, and an electrode 247 of the storage capacitance is formed simultaneously with the second conductive layer.

With the second conductive layers 243, 244, 245 and 246 as a mask, an n-type impurity element was added for the second time to form second impurity regions. At this time, the resist masks 223, 224, 225, 226 and 227 used to pattern the second conductive layer may be left as they are. Here, an ion doping method using phosphine ($PH_3$) was similarly performed. In this process, too, the acceleration voltage was set at a relatively high level of 80 keV to inject phosphorus through the gate insulating film 203 into the semiconductor layer below. The second impurity regions should preferably have a phosphorus concentration in the range of $1\times20^{20}$ to $1\times10^{21}$ atoms/cm$^3$ to form source regions 230 and 237 and drain regions 231 and 241 of the n-channel TFT. Here the concentration was set at $1\times10^{20}$ atoms/cm$^3$ (FIG. 2(C)).

Further, though not shown, it is also possible to remove the gate insulating film covering the source regions 230 and 237 and the drain regions 231 and 241 to expose these regions of the semiconductor layer and directly inject phosphorus into these regions. The use of this process can reduce the acceleration voltage of the ion doping method down to 10 keV and allows for efficient doping of phosphorus.

The regions 233 and 234 of the p-channel TFT are also doped with the same concentration of phosphorus but because in a later process boron is added at two times that concentration, the conductivity type is not reversed, posing no problem to the operation of the p-channel TFT.

After the state of FIG. 2(C) was obtained, the resist masks 223, 224, 225, 226 and 227 were removed and a photoresist film was formed again and patterned by exposure from the back. At this time, with the first and second conductive layers used as masks, resist masks 248, 249, 250, 256 and 257 were self-aligningly formed as shown in FIG. 3(A). The exposure from the back utilizes direct light and scattered light, and overexposure allowed the resist masks to be formed inside the second conductive layer.

Unmasked portions of the second conductive layer were etched away by an ordinary dry etching technique using $CF_4$ and $O_2$ gases. Then, as shown in FIG. 3(B), the second conductive layer was etched back by a length L5 (corresponding to a portion represented by the same reference number in FIG. 16). The length L5 should be adjusted in the range of 0.1 to 3 μm. Here the length was set to 0.5 μm. As a result, in the first impurity region of the n-channel TFT that will make the LDD region and which is 1.5 μm long, there were formed a region 1 μm long (L4) over which the first impurity region overlaps the second conductive layer and a region 0.5 μm long (L5) over which the first impurity region does not overlap the second conductive layer.

Next, with the photoresist masks 258, 259 covering the areas where the n-channel TFT is to be formed, a p-type impurity is doped only in a region where the p-channel TFT is to be formed. The impurity elements known to produce a p-type conductivity include boron (B), aluminum (Al) and gallium (Ga). Here boron was used as an impurity element and the ion doping method using diborane ($B_2H_6$) was performed. The acceleration voltage was similarly set at 80 keV to add boron at the density of $2 \times 10^{20}$ atoms/cm$^3$. As shown in FIG. 3(B), third impurity regions 262 and 261 heavily doped with boron were formed. The third impurity regions at a later process form a source region 261 and a drain region 262 of a p-channel TFT.

The n- or p-type impurity elements that were added at their respective concentrations are, in their own states, not active and thus must be activated. This can be achieved by a thermal annealing using electric furnace, a laser annealing using the excimer laser, and a rapid thermal annealing (RTA) using a halogen lamp.

The thermal annealing activated the impurity elements by heating them at 550° C. for two hours in the presence of nitrogen. This example employs a clad constitution in which Al is used for the conductive layer (B) making up the first conductive layer. Because the conductive layer (A) and the second conductive layer, both made of Ta, are formed to cover the Al, the Ta layers function as blocking layers to prevent diffusion of Al atoms into other regions. The laser annealing converges the KrF excimer laser beam of pulse oscillation type into a linear beam and applies the beam to the impurity elements for activation. Performing the thermal annealing after the laser annealing produced a better result. This process also serves to anneal the regions where crystals were destroyed by the ion doping and improve the crystallinity of the regions.

With the above processes completed, the gate electrode is formed which comprises the first conductive layer and the second conductive layer in contact with the first conductive layer, and the semiconductive layers 204, 206 formed have the first impurity region that will make the LDD region and the second impurity region that will make a source region and a drain region. The first impurity region has a region where it overlaps the second conductive layer with the gate insulating film interposed therebetween and a region where it does not. The p-channel TFT, on the other hand, is formed with a channel forming region, a source region and a drain region.

With the state of FIG. 3(B) obtained, the resist masks 258, 259 are removed and a first interlayer insulating film 263 is formed to a thickness of 1,000 nm. The first interlayer insulating film 263 may use a silicon oxide film, a silicon nitride film, a silicon oxynitride film, an organic resin film or a laminated layer of these. This example uses a two-layer constitution, though not shown, in which a silicon nitride film is first formed to a thickness of 50 nm followed by a silicon oxide film 950 nm thick.

The first interlayer insulating film 263 is then patterned to form contact holes in the source region and the drain region of each TFT. Then source lines 264, 265, 266 and drain lines 267, 268 are formed. Though not shown, this example forms these electrodes as wires of a three-layer constitution which comprises a Ti film 100 nm thick, an Al film, including Ti, 300 nm thick, and a Ti film 150 nm thick, all formed continuously by sputtering.

Then, a passivation film 269 is formed over the source lines 264, 265, 266, the drain lines 267, 268 and the first interlayer insulating film 263. The passivation film 269 is formed of a silicon nitride film 50 nm thick. Then, a second interlayer insulating film 270 of organic resin is formed to a thickness of about 1,000 nm. The organic resin film can use polyimide, acrylics, polyimideamide, etc. The advantages of using an organic resin film include the ease with which the deposition can be done and a low relative dielectric constitution which in turn reduces parasitic capacitance, and an excellent flatness. Other organic resin films may be used. Here, polyimide of a type which thermally polymerizes after application to the substrate is used and sintered at 300° C. to form the second interlayer insulating film.

In this way, the active matrix substrate having the CMOS circuit and the pixel area formed on the substrate 201, as shown in FIG. 3(C), is manufactured. A storage capacitance is simultaneously formed on the drain side of the pixel TFT.

EXAMPLE 2

This example shows an example case where, after the state shown in FIG. 2(C) has been obtained by the same process as in the example 1, a part of the second conductive layer is removed by other method to form a region where the first impurity region overlaps the second conductive layer and a region where it does not.

Figure 4A:
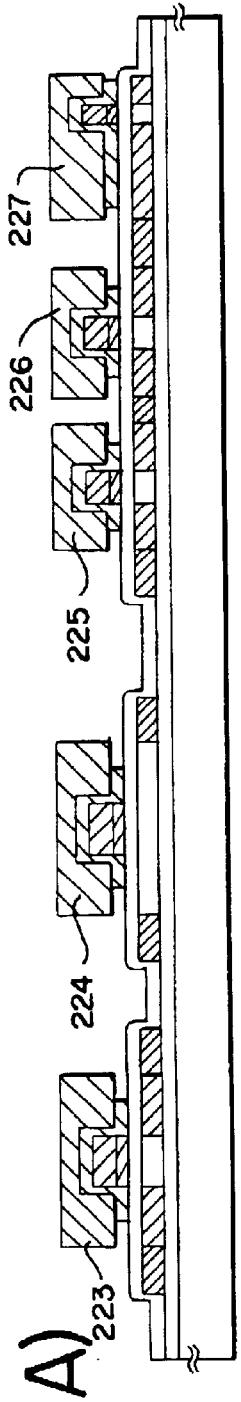
FIG. 4 is a cross sectional view showing a process of manufacturing the TFT.

First, as shown in FIG. 2(C), the resist masks 223, 224, 225, 226, 227 used in the process of patterning the second conductive layer are used as is to etch back a part of the second gate electrode by a length L5 as shown in FIG. 4(A).

This process was performed by dry etching. Depending on the material of the second conductive layer, a fluorine-based gas is basically used to achieve an isotropic etch and thereby remove those parts of the second conductive layer beneath the resist masks. The etching gas, for example, is a $CF_4$ gas for Ta, a $CF_4$ or $CCl_4$ gas for Ti, and an $SF_6$ or $NF_3$ for Mo.

Figure 4B:
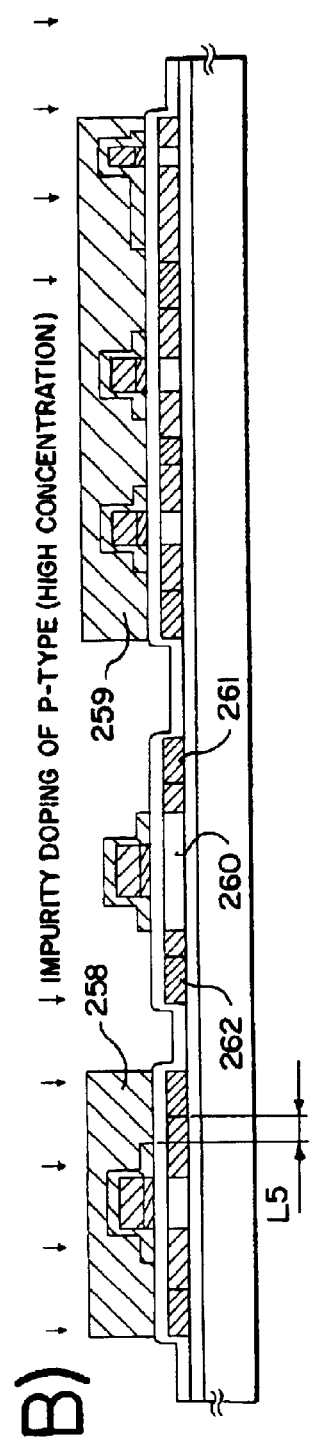

Then, as shown in FIG. 4(B), the second conductive layer is removed by the length L5, i.e., 0.7 μm in this example. As a result, in the n-channel TFT the first impurity region that will make the LDD region has a length of 1.5 μm (L6), in which a region in which the first impurity region overlaps the second conductive layer is formed at 0.8 μm (L4) and a region in which it does not is formed at 0.7 μm (L5).

Figure 4C:
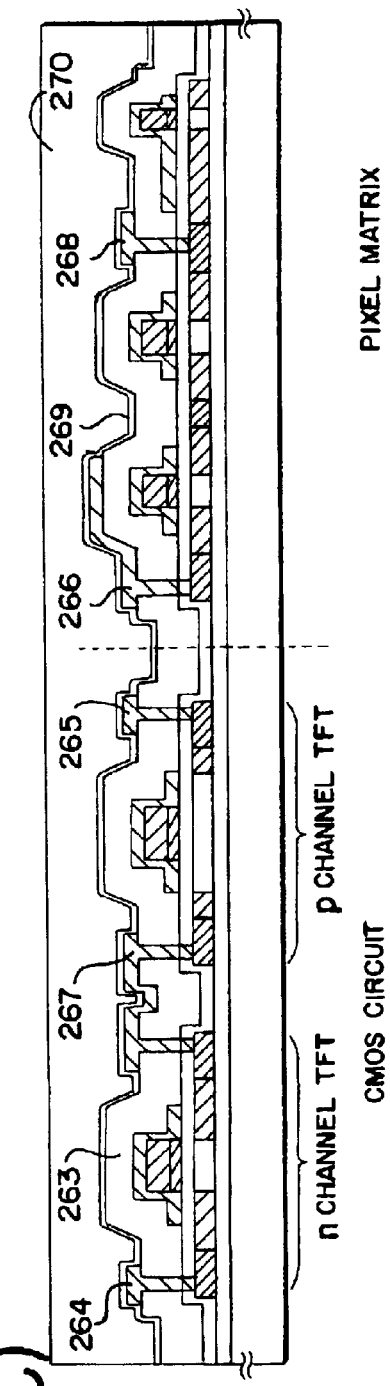

The subsequent processes were performed in a manner similar to example 1 to form an active matrix substrate shown in FIG. 4(C).

EXAMPLE 3

This example describes a process of manufacturing an active matrix liquid crystal display from an active matrix substrate formed in the example 1 or example 2.

In the active matrix substrate as shown in FIG. 3(C) or FIG. 4(C), contact holes are formed in the second interlayer insulating film 270 to reach the drain line 268, and then a pixel electrode 271 is formed. The pixel electrode 271 uses a transparent conductive film for a transmission type liquid crystal display and a metal film for a reflection type liquid crystal display. Here, in order to fabricate a transmission type liquid crystal display, an indium-tin oxide (ITO) film is sputtered to a thickness of 100 nm to form the pixel electrode 271.

Figure 5A:
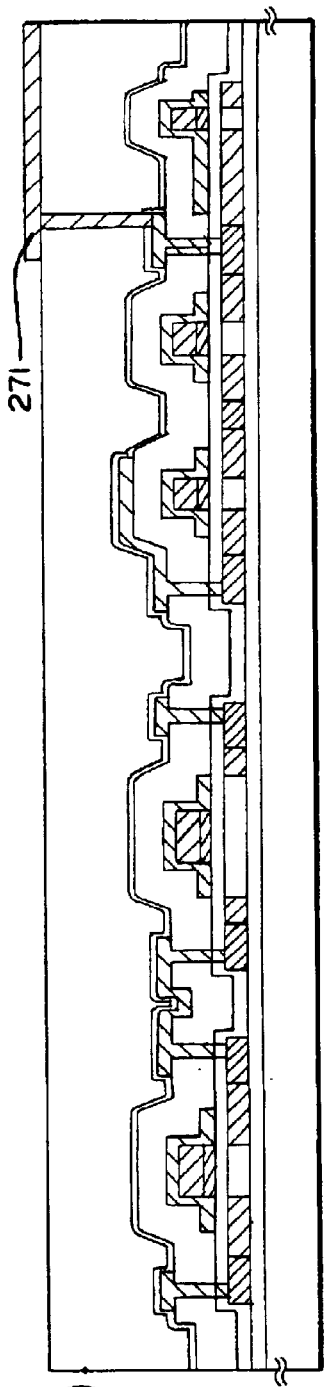
FIG. 5 is a cross sectional view showing a process of manufacturing the TFT.

After the state of FIG. 5(A) is obtained, an alignment film 272 is formed over the second interlayer insulating film 270 and the pixel electrode 271. Generally, the alignment film for the liquid crystal display element often uses a polyimide resin. A counter substrate 273 is formed with a transparent conductive film 274 and an alignment film 275. The alignment film, after being formed, is rubbed to orientate liquid crystal molecules parallelly at a predetermined pretilt angle.

Figure 5B:
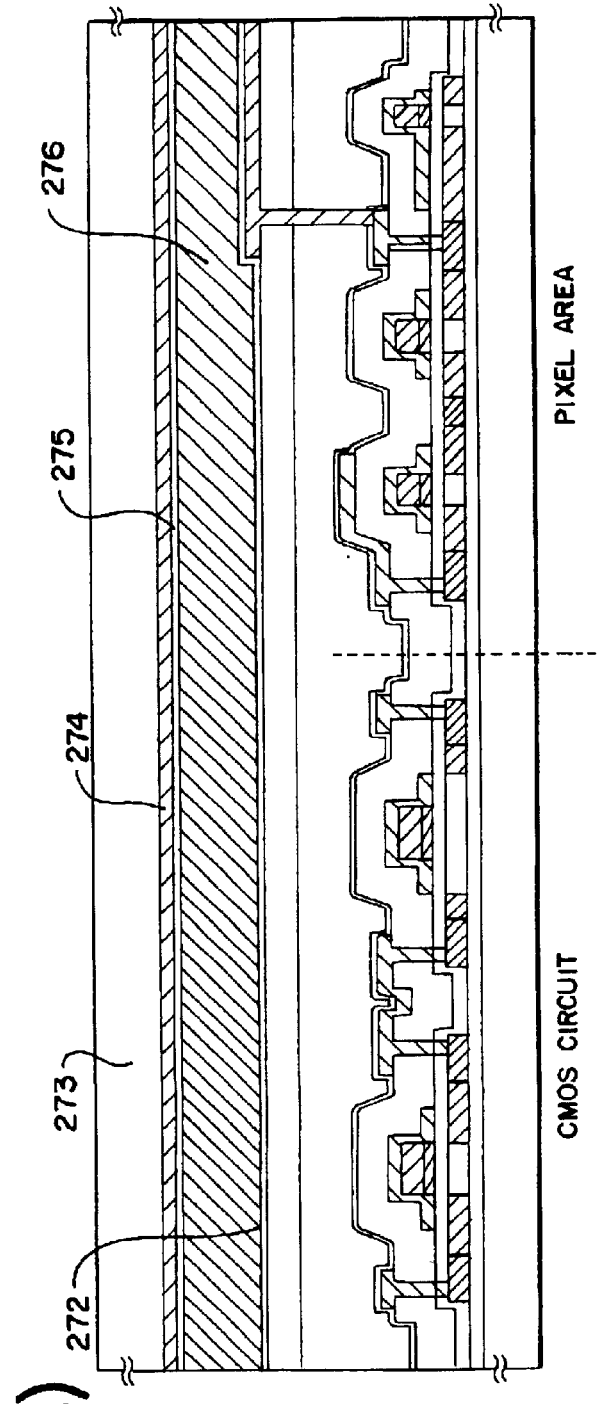

After constitution of the above process, the active matrix substrate formed with the pixel area and the CMOS circuits and the counter substrate are sealed together by a known cell assembly process with a sealing material and spacers (neither of them shown) interposed therebetween. Then, a liquid crystal material 276 is injected between the substrates and completely sealed with a sealant (not shown). Now, the active matrix liquid crystal display as shown in FIG. 5(B) is completed.

Next, the constitution of the active matrix liquid crystal display of this example will be explained by referring to FIGS. 7 and 8. FIG. 7 is a perspective view of the active matrix liquid crystal display of this example. The active matrix substrate comprises a pixel area 701, a scan (gate) line driving circuit 702 and a data (source) line driving circuit 703. A pixel TFT 700 in the pixel area is an n-channel TFT and the driving circuits provided around the pixel area are basically CMOS circuits. The scan (gate) line driving circuit 702 and the data (source) line driving circuit 703 are connected to the pixel area 701 by gate lines 802 and source lines 803, respectively.

FIG. 8(A) shows a top view of the pixel area 701 for almost one pixel. The pixel area is provided with an n-channel TFT. A gate electrode 820 formed contiguous to a gate line 802 crosses an underlying semiconductor layer 801 with a gate insulating film not shown interposed therebetween. Though not shown, the semiconductor layer is formed with a first impurity region and source and drain regions formed as a second impurity region. On the drain side of the pixel TFT is formed a storage capacitance 807 which comprises the semiconductor layer, the gate insulating film, and an electrode made of the same material as the first and second conductive layers. A capacitive line 821 connected to the storage capacitance 807 is laid parallel to the gate line 802. The cross-sectional constitution along the line A–A' of FIG. 8(A) corresponds to the cross sections of the pixel area shown in FIGS. 3(C) and 4(C).

In the CMOS circuit shown in FIG. 8(B), gate electrodes 813 and 814 extending from a gate line 819 cross underlying semiconductor layers 810 and 812, respectively, with a gate insulating film not shown interposed therebetween. Though not shown, the semiconductor layer of the n-channel TFT is similarly formed with a first impurity region and source and drain regions formed as a second impurity region. The semiconductor layer of the p-channel TFT is formed with source and drain regions formed as a third impurity region. As to the positional relationship, the cross-sectional constitution along the line B—B' corresponds to the cross sections of the pixel area shown in FIG. 3(C) or FIG. 4(C).

While this example has the pixel TFT 700 arranged in a double gate constitution, it may be formed as a single gate constitution, or a multigate constitution such as a triple gate constitution. The constitution of the active matrix substrate is not limited to that of this example. The constitution of this invention is characterized by the constitution of the gate electrode, by the constitution of the source and drain regions of the semiconductor layer formed under the gate electrode with a gate insulating film interposed therebetween, and by the constitution of other impurity regions. Other constitution can be appropriately determined by a person implementing this invention.

EXAMPLE 4

Figure 6A:
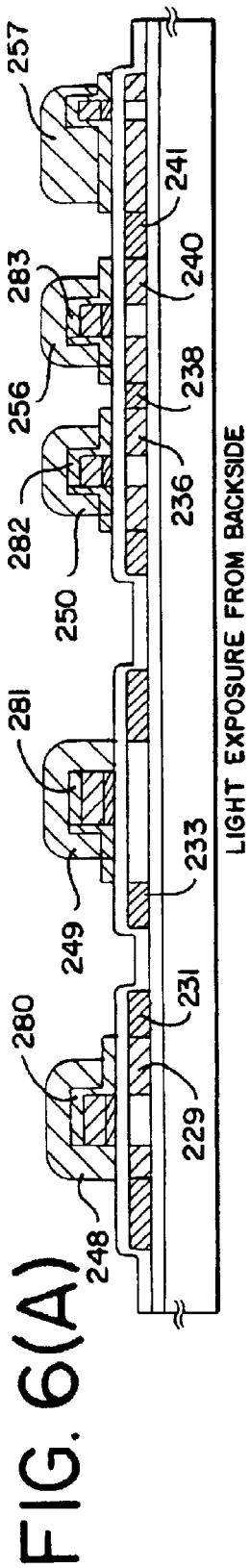
FIG. 6 is a cross sectional view showing a process of manufacturing the TFT.

This example describes an example case which is similar in the process to the example 1, but in which the constitution of the second conductive layer of the gate electrode in the n- and p-channel TFTs of the pixel TFT and CMOS circuit differs from that of the example 1. As shown in FIG. 6(A), the second conductive layers 280, 281, 282 and 283 are in contact with the first conductive layers and extend only on the drain side of each TFT. Even with the second conductive layers arranged in this configuration, a high electric field generated on the drain side can be alleviated by forming first impurity regions 229, 236 and 240 in contact with the drain regions 231, 238 and 241 of the n-channel TFTs.

The process of this example is basically similar to that of the example 1, except that only the photoresist mask used in the patterning process is changed to form the second conductive layer, with no other processes changed. However, the first impurity region 229 of the n-channel TFT is formed only on the drain region side.

The first impurity region formed has a region where it overlaps the second conductive layer with the gate insulating film interposed therebetween and a region where it does not. The p-channel TFT, on the other hand, is formed with a channel forming region 260, a source region 261 and a drain region 262. Then, a first interlayer insulating film 263, source lines 264, 265 and 266, drain lines 267 and 268, and a passivation film 269 are formed. A second interlayer insulating film 270 of organic resin is then formed.

Figure 6B:
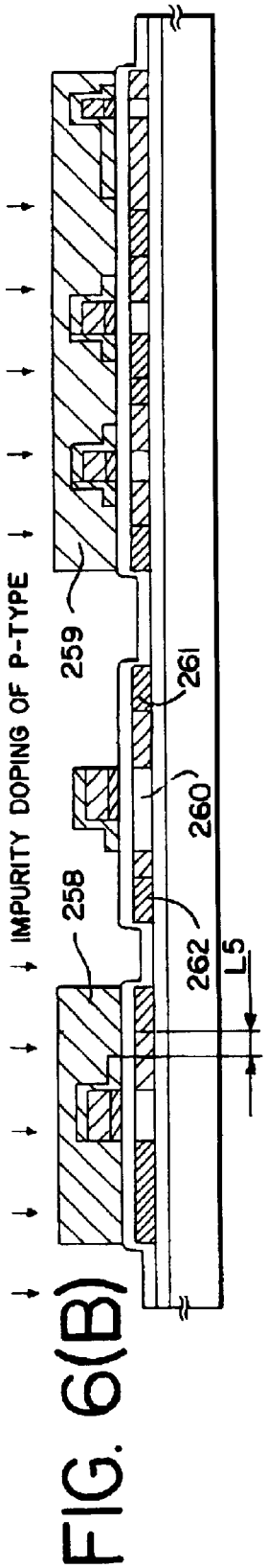
Figure 6C:
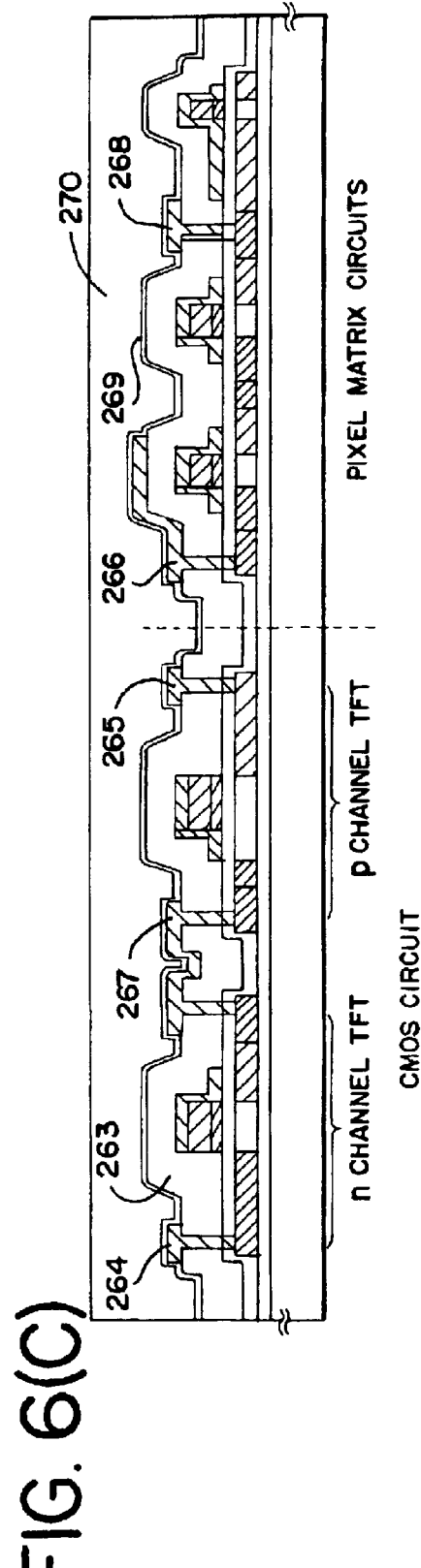

As a result, as shown in FIG. 6(B), the first impurity region formed in the n-channel TFT that will make the LDD region has a region L4 long in which the first impurity region overlaps the second conductive layer and a region L5 long in which it does not. The subsequent processes are performed in a way similar to the example 1 to form the active matrix substrate shown in FIG. 4(C). By using such an active matrix substrate, performing the method described in the example 3 can similarly manufacture a liquid crystal display.

EXAMPLE 5

This example describes an example case in which a crystalline semiconductor film used as the semiconductor layer in the examples 1, 2 and 4 is formed by thermal annealing using a catalytic element. When a catalytic element is used, it is preferred that techniques disclosed in JP-A 7-130652 and 8-78329 be used.

Here, an example of applying the technique disclosed in JP-A 7-130652 to this invention is shown in FIG. 9. First, a substrate 901 is deposited with a silicon oxide film 902, over which an amorphous silicon film 903 is formed. Further, a nickel acetate solution containing 10 ppm by weight of nickel is applied to the amorphous silicon film to form a nickel-containing layer 904 (FIG. 9(A)).

Next, the substrate is heated at 500° C. for one hour for dehydrogenation. After this, the substrate is heat-treated in a temperature range of 500 to 650° C. for 4 to 12 hours, for example, at 550° C. for 8 hours, to form a crystal silicon film 905. The crystal silicon film 905 thus formed has a very good crystallinity (FIG. 9(B)).

The technique disclosed in JP-A 8-78329 enables selective crystallization of an amorphous semiconductor film by selectively adding a catalytic element. An example case of applying this technique to the present invention will be explained by referring to FIG. 10.

First, the glass substrate 1001 is deposited with a silicon oxide film 1002, over which an amorphous silicon film 1003 and a silicon oxide film 1004 are successively formed. At this time, the thickness of the silicon oxide film 1004 is set to 150 nm.

Then, the silicon oxide film 1004 is patterned to selectively form holes 1005, after which a solution of nickel acetate containing 10 ppm by weight of nickel is applied to form a nickel-containing layer 1006 on the surface. The nickel-containing layer 1006 contacts the amorphous silicon film 1002 only at the bottom of the holes 1005 (FIG. 10(A)).

Next, the substrate is heat-treated in the temperature range of 500 to 650° C. for 4 to 24 hours, for example at 570° C. for 14 hours, to form a crystal silicon film 1007. In this crystallization process, those portions of the amorphous silicon film which are contacted by nickel crystallize first, with the crystallization propagating in the horizontal direction. The crystal silicon film 1007 thus formed is an aggregation of bar- or needle-like crystals which, when viewed macroscopically, grow in a particular orientation, thus offering the advantage of aligned crystallinity (FIG. 10(B)).

The catalytic elements that can be used in the above two techniques include iron (Fe), palladium (Pd), tin (Sn), lead (Pb), cobalt (Co), platinum (Pt), copper (Cu) and gold (Au) in place of nickel (Ni).

Using the above techniques to form a crystal semiconductor film (including a crystal silicon film and a crystal silicon-germanium film) and patterning the crystal semiconductor film can form a semiconductor layer of a crystal TFT. The TFT manufactured from the crystal semiconductor film by using the technique of this example has an excellent characteristic but requires to have high reliability. However, by using the TFT constitution of this invention, it is possible to manufacture a TFT taking full advantage of the technique of this example.

EXAMPLE 6

This example describes an example case in which the method of forming a semiconductor layer used in the examples 1, 2 and 4 involves using an amorphous semiconductor film as an initial film, transforming the amorphous semiconductor film into a crystal semiconductor film by using the catalytic element described above, and removing the catalytic element from the crystal semiconductor film. This example uses the technique disclosed in JP-A 10-247735, 10-135468 or 10-135469.

The technique described in the above official gazettes is the one to remove the catalytic element used for crystallizing the amorphous semiconductor film by using the gettering action of phosphorus after the amorphous semiconductor film is crystallized. The use of this technique can reduce the concentration of the catalytic element in the crystal semiconductor film down to $1 \times 10^{17}$ atoms/cm$^3$ or less, preferably to $1 \times 10^{16}$ atoms/cm$^3$.

Figure 11A:
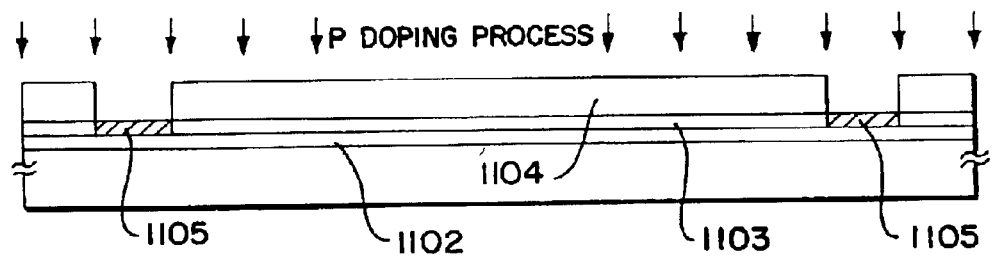
FIG. 11 is a schematic diagram showing a process of manufacturing a crystalline silicon film.
Figure 11B:
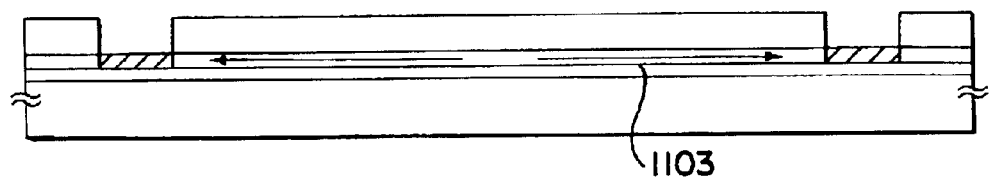

The constitution of this example will be explained by referring to FIG. 11. A glass substrate 1101 is an alkali-free glass substrate represented by 1737 substrate of Corning make. FIG. 11(A) shows a constitution in which a base film 1102 and a crystal silicon film 1103 are formed by using the crystallization technique shown in the example 5. Then, a silicon oxide film 1104 as a mask is formed over the surface of the crystal silicon film 1103 to a thickness of 150 nm and then patterned to form holes in which to expose the crystal silicon film. A phosphorus adding process is performed to form regions 1105 where the crystal silicon film is doped with phosphorus.

In this state, the substrate is heated in the presence of nitrogen in the temperature range of 550 to 800° C. for 5 to 24 hours, for example at 600° C. for 12 hours. The regions 1105 in which the crystal silicon film is doped with phosphorus act as gettering sites to cause the catalytic element remaining in the crystal silicon film 1103 to be segregated in the regions 1105 doped with phosphorus.

Then, the silicon oxide film 1104 for masking and the phosphorus-doped regions 1105 are etched away to obtain a crystal silicon film whose concentration of the catalytic element used in the crystallization process is lowered to $1 \times 10^{17}$ atoms/cm$^3$. This crystal silicon film can be directly used as the semiconductor film of TFT of this invention shown in the examples 1, 2 and 4.

EXAMPLE 7

Figure 12A:
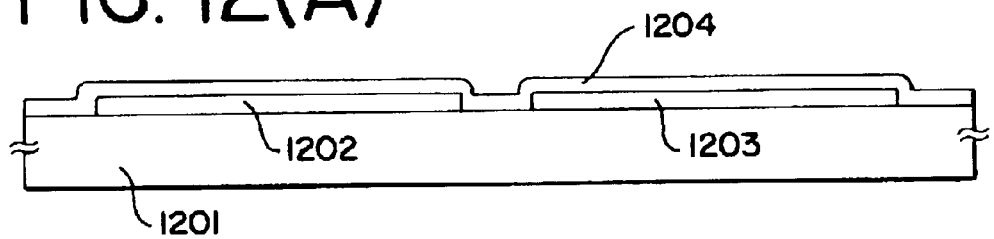
FIG. 12 is a schematic diagram showing a process of manufacturing a crystalline silicon film.
Figure 12B:
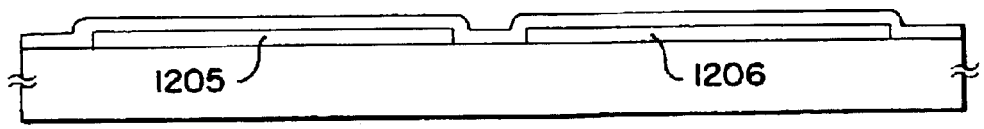

This example describes another example case in which a semiconductor layer and a gate insulating film are formed in the process of manufacturing a TFT of this invention shown in the examples 1, 2 and 4. The constitution of this example will be explained by referring to FIG. 12.

Here, a substrate with heat resistance of at least about 700 to 1,100° C. is needed and a quartz substrate 1201 is used. By using the technique shown in the example 5, a crystal semiconductor film is formed. To transform this crystal semiconductor film into the semiconductor layer of the TFT, the crystal semiconductor film is patterned into islands to form semiconductor layers 1202, 1203, which are then covered with a gate insulating film 1204 composed mainly of silicon oxide. In this example, a silicon oxynitride film is formed by a plasma CVD method to a thickness of 70 nm (FIG. 12(A)).

Then, the substrate is heat-treated in an atmosphere containing halogen (typically chlorine) and oxygen. This is done at 950° C. for 30 minutes in this example. The heat treatment temperature can be selected in the range of 700 to 1,100° C. and the processing time may range from 10 minutes to 8 hours (FIG. 12(B)).

As a result, under the condition of this example, an interface between the semiconductor layers 1202, 1203 and the gate insulating film 1204 is thermally oxidized to form a gate insulating film 1207. During the process of oxidation in the presence of halogen gas, impurities contained in the gate insulating film 1204 and the semiconductor layers 1202, 1203, particularly metal impurity elements, react with halogen to form compounds, thus releasing the impurities in a gas phase.

The gate insulating film 1207 fabricated in the process described above has high insulation resistance and the interface between the semiconductor layers 1205, 1206 and the gate insulating film 1207 is very good. To realize the constitution of the TFT according to this invention, the subsequent processes need only to follow those of the examples 1, 2 and 4.

EXAMPLE 8

This example shows in FIG. 13 an example of manufacturing a crystal TFT by a sequence of processes different from that of the examples 1. The semiconductor layers 204, 205, 206 of the example 1 shown in FIG. 2(A) use crystal silicon films fabricated by the method shown in the example 5. The catalytic element used in the crystallization process remains in a small amount in the semiconductor layers. The subsequent processes up to the step in FIG. 3(B) of doping a p-type impurity are performed according to the example 1. Then the resist masks 258, 259 are removed.

At this time, as shown in FIG. 13, the source regions 230, 237 and drain regions 231, 238, 241 of the n-channel TFT and the source region 261 and drain region 262 of the p-channel TFT are both doped with phosphorus during the process of FIG. 2(C). According to the example 1, the phosphorus concentration is $1 \times 10^{19}$–$1 \times 10^{21}$ atoms/cm$^3$.

In this state, the substrate is heat-treated in the presence of nitrogen at 500 to 800° C. for 1 to 24 hours, for example, at 600° C. for 12 hours. This process can activate the n- and p-type impurity elements added. Further, the phosphorus-doped regions become gettering sites to segregate the catalytic elements remaining after the crystallization process. As a result, the catalytic elements can be removed from the channel forming regions.

After completion of the process of FIG. 13, the subsequent steps are performed according to the example 1 to form the state shown in FIG. 3(C), thus manufacturing the active matrix substrate. By using such an active matrix substrate, performing the process as described in the example 3 can produce the similar liquid crystal display.

EXAMPLE 9

This example shows in FIG. 14 example constitution of the gate electrode in the TFT according to this invention. The gate electrode comprises a first conductive layer and a second conductive layer formed in contact with the first conductive layer. The first conductive layer comprises one or more conductive layers.

FIG. 14(A) shows a constitution in which a conductive layer (A) of the first conductive layer formed in contact with a gate insulating film is formed of a Ta film, a conductive layer (B) deposited over the conductive layer (A) is formed of Ti, a conductive layer (C) is formed of a film made mainly of Al, and a fourth conductive layer on top is made of Ti. It is preferred that the conductive layer (A) have a thickness of 30 to 200 nm and other conductive layers a thickness of 50 to 100 nm.

The conductive layer (A) in contact with the gate insulating film serves as a barrier layer to prevent chemical elements making up the overlying conductive layer from diffusing into the gate insulating film and should preferably use a high melting point metal such as Ti, Ta, W and Mo or their alloy material. The conductive layer (C) formed in FIG. 14(A) is made of a film mainly containing Al and used to reduce the resistivity of the gate electrode. To increase flatness of the Al film formed, it is desirable to use an Al alloy film containing 0.1–5 atm % of elements such as scandium (Sc), Ti and silicon (Si). In either case, when this invention is applied to a liquid crystal display of 10-inch or larger size, it is preferred that a material with a low resistivity containing mainly Al or Cu be used to reduce the resistance of the gate electrode. Further, the first conductive layer and the second conductive layer formed in contact with the gate insulating film preferably use a high melting point metal such as Ti, Ta, W and Mo or their alloy material.

FIG. 14(B) shows another example of the gate electrode constitution in which the first conductive layer is formed of a single layer of Mo—W alloy film and the second conductive layer is formed of a Ti—Mo alloy film. The first conductive layer may be formed in a single layer whose thickness may be set in the range of 50 to 100 nm.

FIG. 14(C) shows a constitution in which the conductive layer (A) making up the first conductive layer is formed of Ti film, the conductive layer (B) is formed of a film having copper (Cu) as a major component, and the conductive layer (C) is formed of Ti film. The resistivity of the gate electrode can also be lowered by using Cu film instead of Al film. The second conductive layer is formed of Ti film.

FIG. 14(D) shows a constitution in which the conductive layer (A) making up the first conductive layer is formed of Ti film, the conductive layer (B) is formed of a film having Al as a major component, and the conductive layer (C) is formed of Ti film. The second conductive layer is formed of Mo film.

EXAMPLE 10

Figure 18:
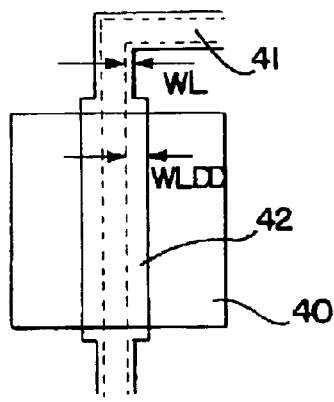
FIG. 18 is a schematic diagram showing the constitution of a gate electrode.

This example explains, by referring to FIG. 18, an example case where the TFT forming area and the line area have different lengths corresponding to L4 of FIG. 16.

In FIG. 18, over the semiconductor layer 140 are formed a first conductive layer 141 and a second conductive layer 142. The second conductive layer 142 is formed to cover and hide the first conductive layer 141. In this specification the length of a portion that does not overlap the first conductive layer 141 is defined as L4.

In this example, the length of L4 in the TFT forming area (on the semiconductor layer) (denoted $W_{LDD}$) is set to 0.1 to 2 μm (typically 0.3 to 1.5 μm). The length L4' in the line area (on other than the semiconductor layer) (denoted $W_L$) is set to 0.05 to 0.5 μm (typically 0.1 to 0.3 μm).

This example is characterized in that the line width of the second conductive layer is narrower in the line forming area than in the TFT forming area. In the line forming area a region corresponding to L4 is not necessary but hinders an increase in the packing density of lines, which means that the line width should be made as narrow as possible.

Hence, the use of the constitution of this example facilitates increasing the integration of lines, contributing to a higher integration of semiconductor device. The constitution of this example can be combined freely with any constitution of the examples 1 to 12.

EXAMPLE 11

This example explains, by referring to FIG. 21, an example case in which this invention is applied to a display (organic EL display) using an active matrix type organic electroluminescence (organic EL) material. FIG. 21(A) shows a circuit diagram of an active matrix type organic EL display having a display area formed on a glass substrate and driving circuits formed along the periphery of the display area. The organic EL display comprises a display area 11 formed on the substrate, an X-direction peripheral driving circuit 12, and a Y-direction peripheral driving circuit 13. The display area 11 comprises a switching TFT 30, a storage capacitance 32, a current control TFT 31, an organic EL element 33, X-direction signal lines 18a, 18b, power lines 19a, 19b, and Y-direction signal lines 20a, 20b, 20c.

FIG. 21(B) shows a top view of almost one pixel. The switching TFT 30 and the current control TFT 31 are formed in the same way as in the n-channel TFT shown in FIG. 3(C) of example 1.

Figure 22:
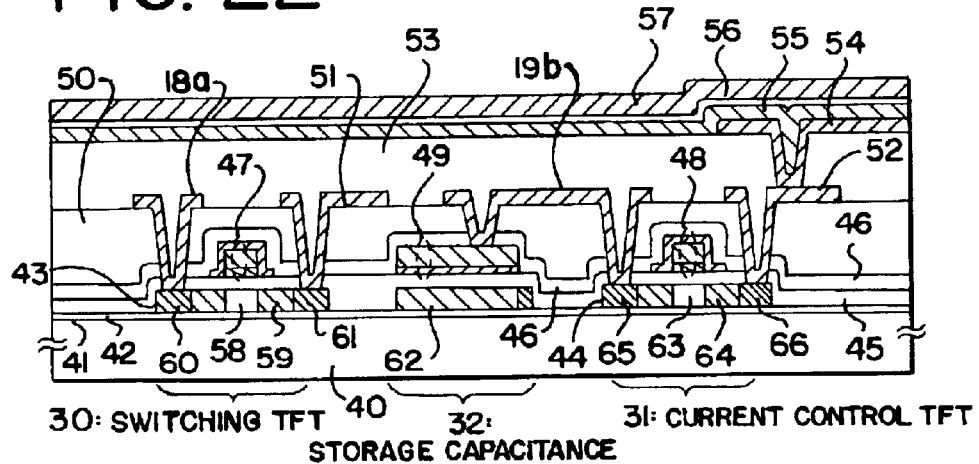
FIG. 22 is a cross sectional view showing the constitution of the pixel area of an active matrix EL display.

FIG. 22 is a cross section taken along the line B–B' of FIG. 21(B), showing the cross section of the switching TFT 30, storage capacitance 32, current control TFT 31 and organic EL element portion. Over a substrate 40, base films 41, 42, gate insulating film 45, first interlayer insulating film 46, gate electrodes 47, 48, capacitance line 49, source and drain lines 18a, 19a, 51, 52, and second interlayer insulating film 50 are formed in the same way as in the example 1. Then, over these layers is formed a third interlayer insulating film 53 in a way similar to the second interlayer insulating film 50. A contact hole reaching the drain line 52 is formed, after which a pixel electrode 54 made of a transparent conductive film is formed. The organic EL element portion comprises the pixel electrode 54; an organic EL layer 55 overlying the pixel electrode and the third interlayer insulating film 53; and a first electrode 56 made of Mg—Ag compound and a second electrode 57 made of Al, formed over the organic EL layer 55. If a color filter, though not shown, is used, a color display is possible. By applying the active matrix substrate manufacturing method shown in the examples 1 to 10, the active matrix type organic EL display can be fabricated easily.

TFT of the active matrix type organic EL display shown in this example can be manufactured according to the method of the example 1. The TFT constitution of this example can suitably be applied to an organic EL display described above.

EXAMPLE 12

This example demonstrates another process for producing an EL (electroluminescence) display device according to the invention of the present application.

Figure 23A:
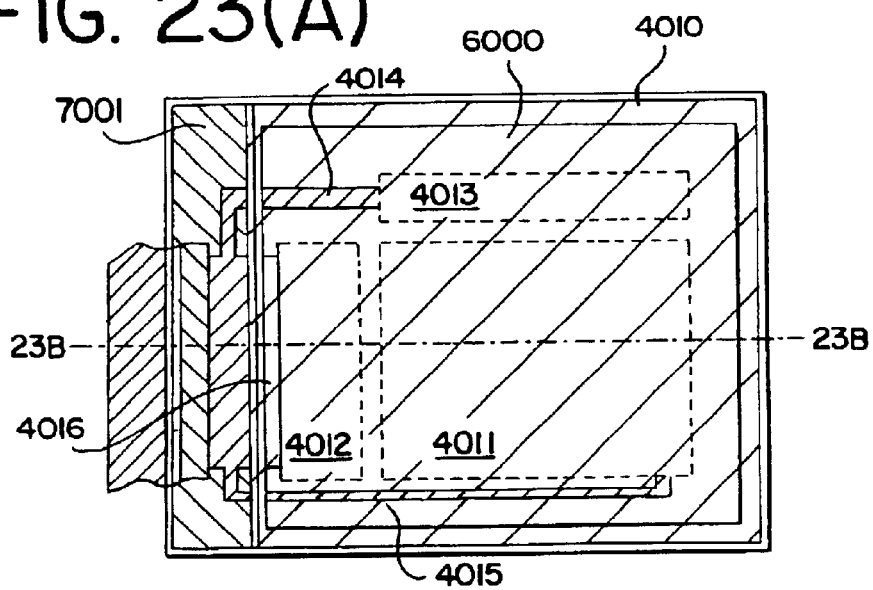
FIG. 23A is a top view showing the constitution of the active matrix EL display.

FIG. 23A is a top view showing an EL display device, which was produced according to the invention of the present application. In FIG. 23A, there are shown a substrate 4010, a pixel part 4011, a driving circuit from the source 4012, and a driving circuit from the gate 4013, each driving circuit connecting to wirings 4014–4016 which reach FPC 4017 leading to external equipment.

The pixel part, preferably together with the driving circuit, is enclosed by a covering material 6000, a sealing material (or housing material) 7000, and an end-sealing material (or second sealing material) 7001.

Figure 23B:
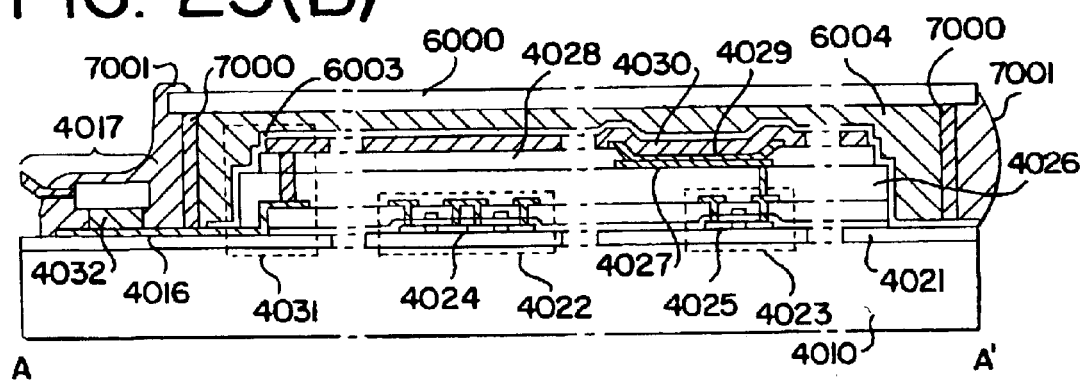
FIG. 23B is a cross section showing the constitution of the active matrix EL display.

FIG. 23B is a sectional view showing the structure of the EL display device in this Example. There is shown a substrate 4010, an underlying coating 4021, a TFT 4022 for the driving circuit, and a TFT 4023 for the pixel unit. (The TFT 4022 shown is a CMOS circuit consisting of an n-channel type TFT and a p-channel type TFT. The TFT 4023 shown is the one, which controls current to the EL element.) These TFTs may be of any known structure (top gate structure or bottom gate structure).

Incidentally, the present invention is used in the TFT 4022 for the driving circuit and the TFT 4023 for the pixel unit.

Upon completion of TFT 4022 (for the driving circuit) and TFT 4023 (for the pixel unit), with their active layer being the semiconductor layer formed according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter maybe applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use sperical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

EXAMPLE 13

Figure 24A:
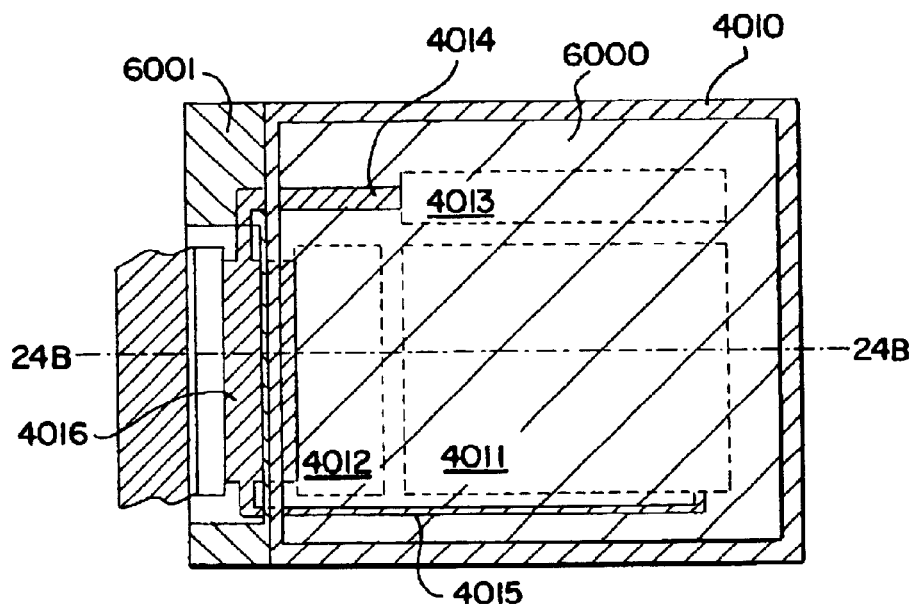
FIG. 24A is a top view showing the constitution of the active matrix EL display.
Figure 24B:
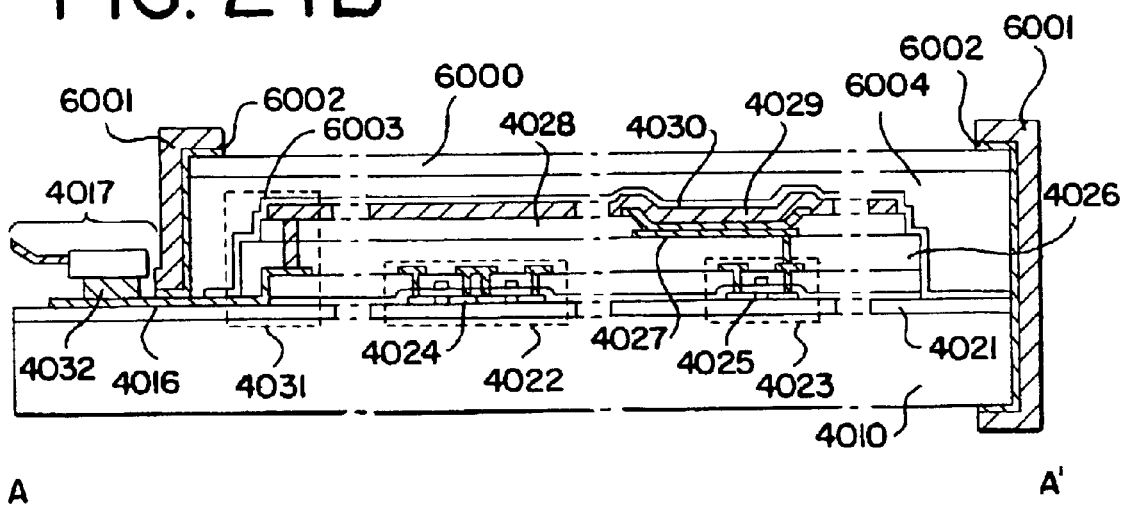
FIG. 24B is a cross section showing the constitution of the active matrix EL display.

In this embodiment, another EL display device having a different structure from the embodiment 12 is explained, as shown in FIGS. 24A and 24B. The same reference numerals in FIGS. 24A and 24B as in FIGS. 23A and 23B indicate same constitutive elements, so an explanation is omitted.

FIG. 24A shows a top view of the EL module in this embodiment and FIG. 24B shows a sectional view of A–A' of FIG. 24A.

According to Embodiment 12, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use sperical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 3404. Then, the flame material 6001 is attached to cover side portions (exposed faces) of the filling material 6004. The flame material 6001 is adhered by the material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

EXAMPLE 14

Figure 25:
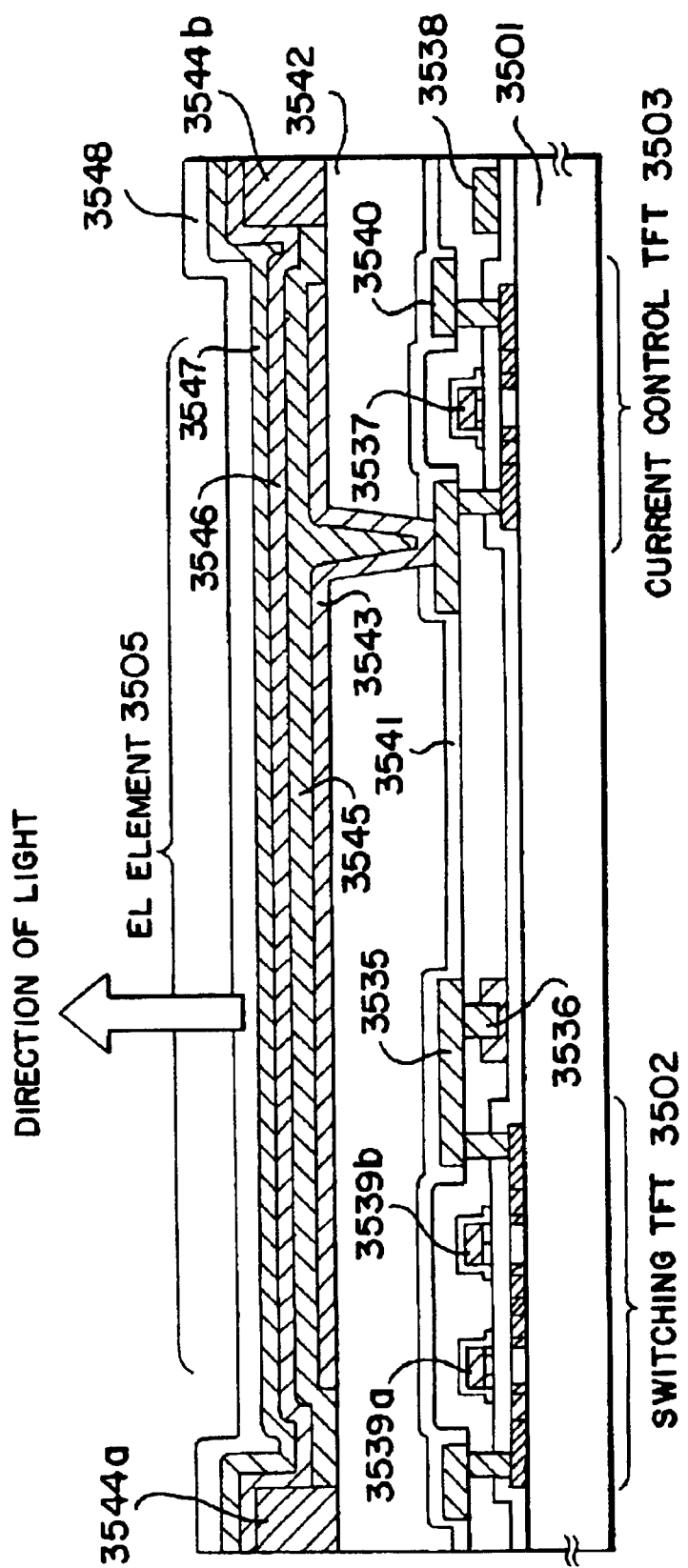
FIG. 25 is a cross section showing a switching TFT and a current control TFT of an active matrix EL display.
Figure 26A:
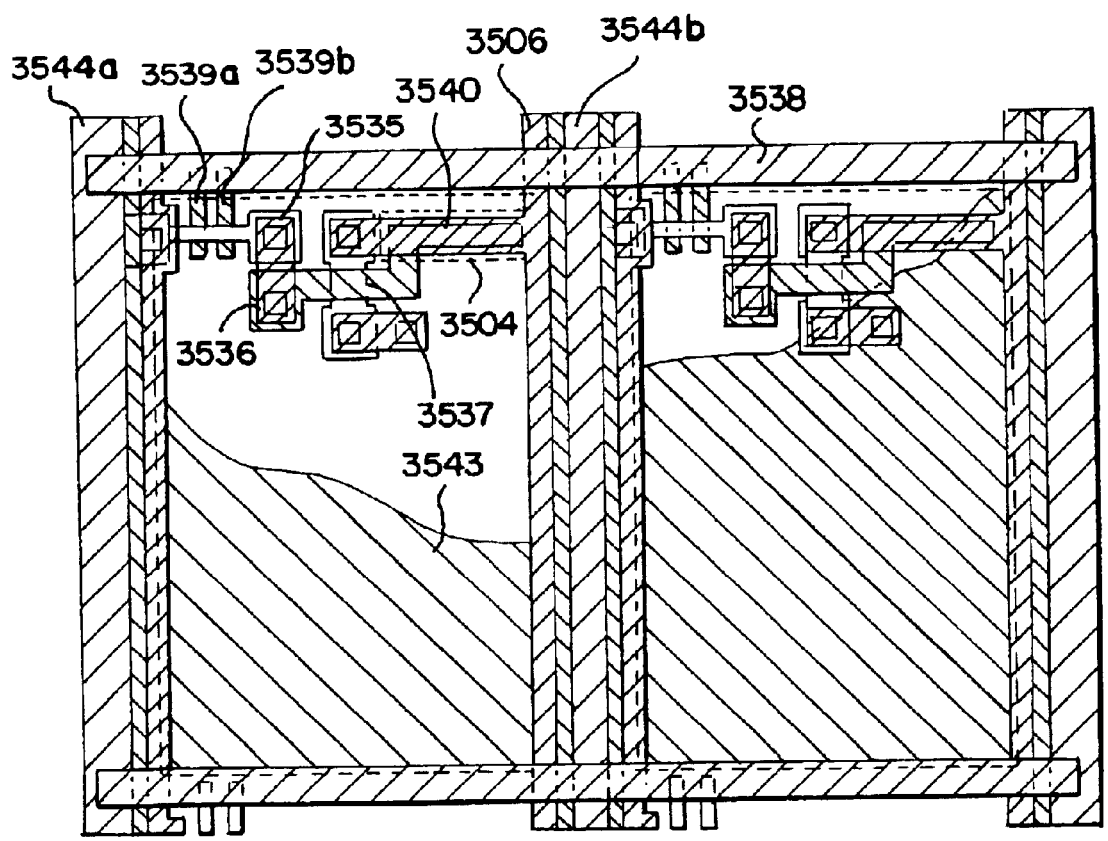
FIG. 26A is a top view showing the constitution of the pixel area of an active matrix EL display.
Figure 26B:
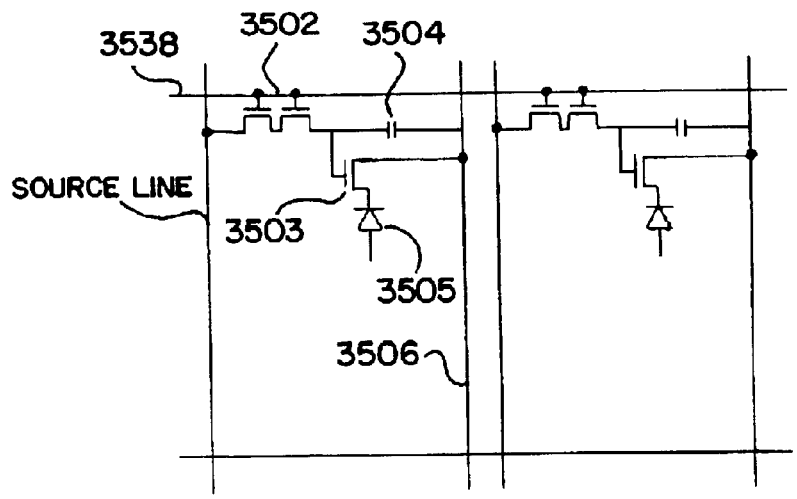
FIG. 26B is a circuit diagram of an active matrix EL display.

In this example, the structure of the pixel region in the panel is illustrated in more detail. FIG. 25 shows the cross section of the pixel region; FIG. 26A shows the top view thereof; and FIG. 26B shows the circuit pattern for the pixel region. In Rig. 25, FIG. 26A and FIG. 26B, the same reference numerals are referred to for the same parts, as being common thereto.

In FIG. 25, the switching TFT 3502 formed on the substrate 3501 is NTFT of the invention (cf. Examples 1 to 11). In this Example, it has a double-gate structure, but its structure and fabrication process do not so much differ from the structures and the fabrication processes illustrated hereinabove, and their description is omitted herein. However, the double-gate structure of the switching TFT 3502 has substantially two TFTs as connected in series, and therefore has the advantage of reducing the off-current to pass therethrough. In this Example, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is NTFT of the invention. The drain wire 3535 in the switching TFT 3502 is electrically connected with the gate electrode 3537 in the current-control TFT, via the wire 3536 therebetween. The wire indicated by 3538 is a gate wire for electrically connecting the gate electrodes 3539a and 3539b in the switching TFT 3502.

It is very important that the current-control TFT 3503 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which an LDD region is so constructed that the gate electrode overlaps with the drain area in the current-control TFT, via a gate-insulating film therebetween.

In this Example, the current-control TFT 3503 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 26A, the wire to be the gate electrode 3537 in the current-control TFT 3503 overlaps with the drain wire 3540 therein in the region indicated by 3504, via an insulating film therebetween. In this state, the region indicated by 3504 forms a capacitor. The capacitor 3504 functions to retain the voltage applied to the gate in the current-control TFT 3503. The drain wire 3540 is connected with the current supply line (power line) 3501, from which a constant voltage is all the time applied to the drain wire 3540.

On the switching TFT 3502 and the current-control TFT 3503, formed is a first passivation film 3541. On the film 3541, formed is a planarizing film 3542 of an insulating resin. It is extremely important that the difference in level of the layered parts in TFT is removed through planarization with the planarizing film 3542. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 3543 indicates a pixel electrode (a cathode in the EL device) of an electroconductive film with high reflectivity. The pixel electrode 3543 is electrically connected with the drain in the current-control TFT 3503. It is preferable that the pixel electrode 3543 is of a low-resistance electroconductive film of an aluminium alloy, a copper alloy or a silver alloy, or of a laminate of those films. Needless-to-say, the pixel electrode 3543 may have a laminate structure with any other electroconductive films.

In the recess (this corresponds to the pixel) formed between the banks 3544a and 3544b of an insulating film (preferably of a resin), the light-emitting layer 44 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include polyparaphenylenevinylene (PVV) materials, polyvinylcarbazole (PVK) materials, polyfluorene materials, etc.

Various types of PVV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33–37" and in Japanese Patent Laid-Open No. 92576/1998. Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Example is to demonstrate the example of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Example, a hole injection layer 46 of PEDOT (polythiophene) or PAni (polyaniline) is formed on the light-emitting layer 3545 to give a laminate structure for the EL layer. On the hole injection layer 46, formed is an anode 3547 of a transparent electroconductive film. In this Example, the light having been emitted by the light-emitting layer 3545 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 3547 is formed, the EL device 3505 is finished. The EL device 3505 thus fabricated herein indicates a capacitor comprising the pixel electrode (cathode) 3543, the light-emitting layer 3545, the hole injection layer 4 and the anode 3547. As in FIG. 36A, the region of the pixel electrode 43 is nearly the same as the area of the pixel. Therefore, in this, the entire pixel functions as the EL device. Accordingly, the light utility efficiency of the EL device fabricated herein is high, and the device can display bright images.

In this Example, a second passivation film 3548 is formed on the anode 3547. For the second passivation film 3548, preferably used is a silicon nitride film or a silicon oxynitride film. The object of the film 3548 is to insulate the EL device from the outward environment. The film 48 has the function of preventing the organic EL material from being degraded through oxidation and has the function of preventing it from degassing. With the second passivation film 3548 of that type, the reliability of the EL display device is improved.

As described hereinabove, the EL display panel of the invention fabricated in this Example has a pixel region for the pixel having the constitution as in FIG. 25, and has the switching TFT through which the off-current to pass is very small to a satisfactory degree, and the current-control TFT resistant to hot carrier injection. Accordingly, the EL display panel fabricated herein has high reliability and can display good images.

The constitution of this Example can be combined with any constitution of Examples 1 to 11 in any desired manner. Incorporating the EL display panel of this Example into the electronic appliance of Example 19 as its display part is advantageous.

EXAMPLE 15

This Example is to demonstrate a modification of the EL display panel of Example 14, in which the EL device 3505 in the pixel region has a reversed structure. For this Example, referred to is FIG. 27. The constitution of the EL display panel of this Example differs from that illustrated in FIG. 26A only in the EL device part and the current-control TFT part. Therefore, the description of the other parts except those different parts is omitted herein.

Figure 27:
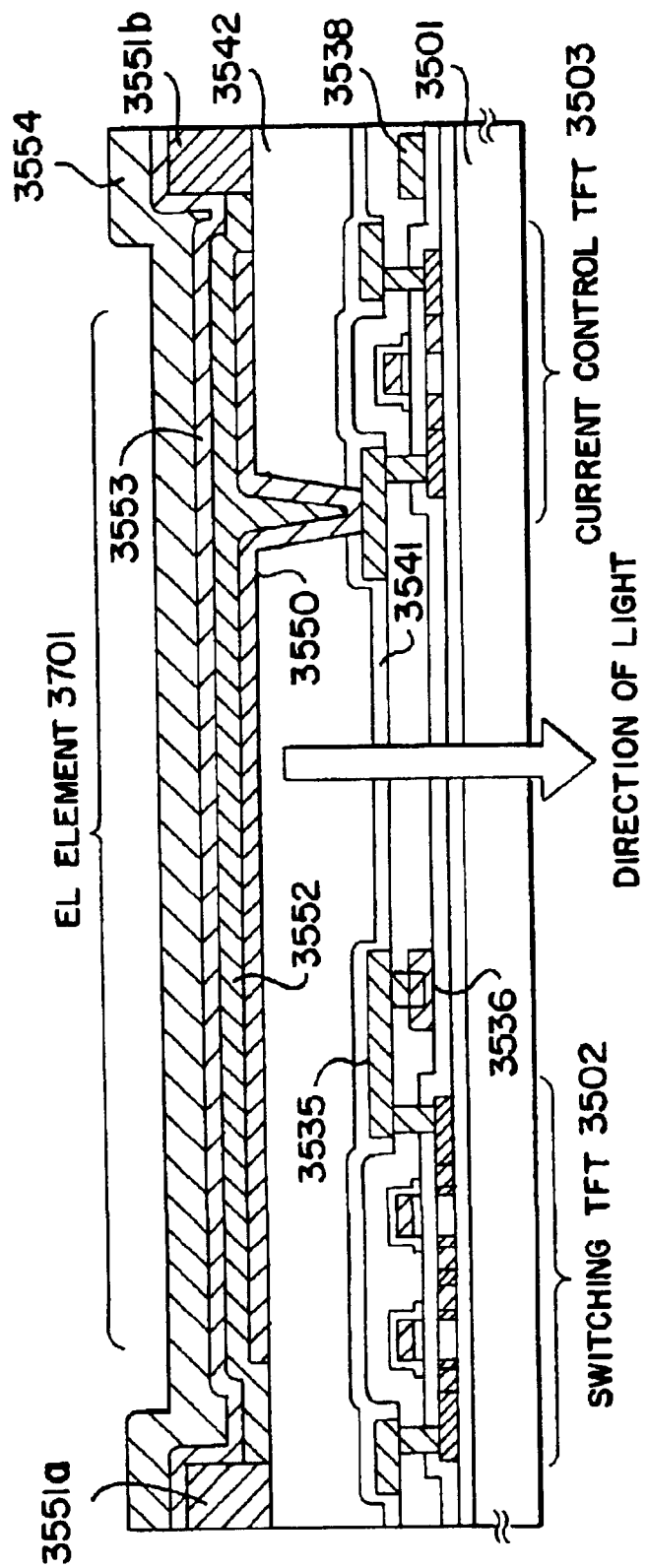
FIG. 27 is a cross section showing the constitution of an active matrix EL display.

In FIG. 27, the current-control TFT 3701 may be PTFT of the invention. For the process of forming it, referred to is that of Example 1 though 11.

In this Example, the pixel electrode (anode) 3550 is of a transparent electroconductive film. Concretely, used is an electroconductive film of a compound of indium oxide and zinc oxide. Needless-to-say, also usable is an electroconductive film of a compound of indium oxide and tin oxide.

After the banks 51a and 51b of an insulating film have been formed, a light-emitting layer 3552 of polyvinylcarbazole is formed between them in a solution coating method. On the light-emitting layer 3552, formed are an electron injection layer 3553 of acetylacetonatopotassium (hereinafter acacK), and a cathode 3554 of an aluminium alloy. In this case, the cathode 3554 serves also as a passivation film. Thus is fabricated the EL device 3701.

In this Example, the light having been emitted by the light-emitting layer radiates in the direction toward the substrate with TFT formed thereon, as in the direction of the arrow illustrated.

The constitution of this Example can be combined with any constitution of Examples 1 through 11 in any desired manner. Incorporating the EL display panel of this Example into the electronic appliance of Example 19 as its display part is advantageous.

EXAMPLE 16

This Example is to demonstrate modifications of the pixel with the circuit pattern of FIG. 26B. The modifications are as in FIG. 28A to FIG. 28C. In this Example illustrated in those FIG. 28A through FIG. 28C, 3801 indicates the source wire for the switching TFT 3802; 3803 indicates the gate wire for the switching TFT 3802; 3804 indicates a current-control TFT; 3805 indicates a capacitor; 3806 and 3808 indicate current supply lines; and 3807 indicates an EL device.

Figure 28A:
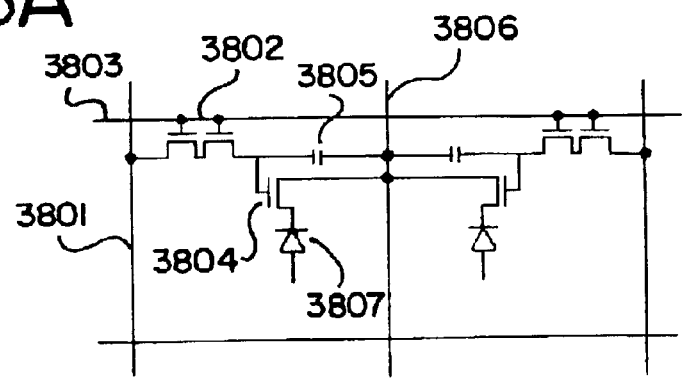
FIGS. 28A through 28C are circuit diagrams of an active matrix EL display.

In the example of FIG. 28A, the current supply line 3806 is common to the two pixels. Specifically, this example is characterized in that two pixels are lineal-symmetrically formed with the current supply line 3806 being the center between them. Since the number of current supply lines can be reduced therein, this example is advantageous in that the pixel pattern can be much finer and thinner.

Figure 28B:
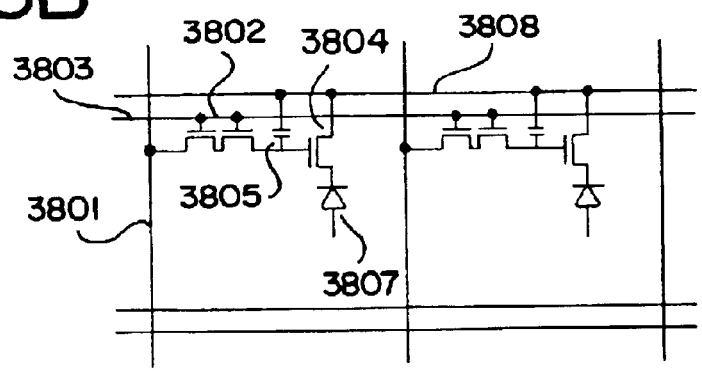

In the example of FIG. 28B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this example is advantageous in that the pixel pattern can be much finer and thinner.

Figure 28C:
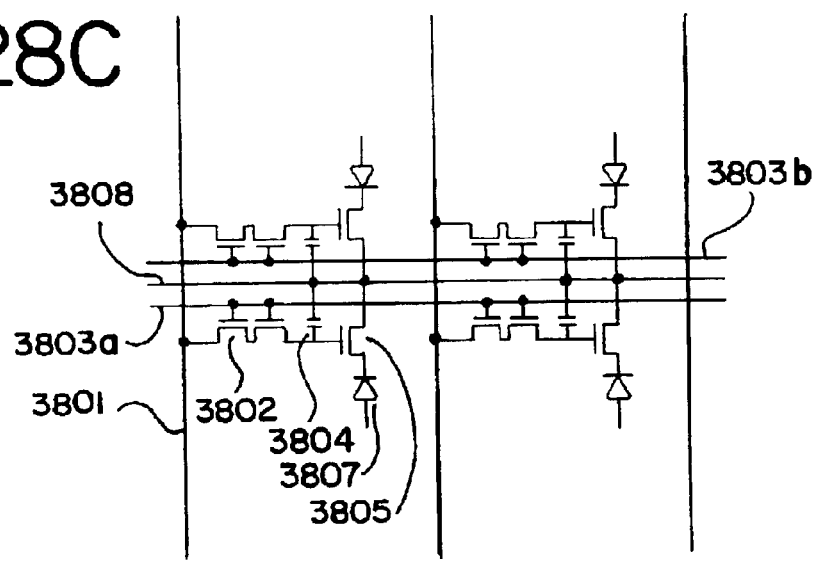

The structure of the example of FIG. 28C is characterized in that the current supply line 3808 is formed in parallel to the gate wires 3803, like in FIG. 38B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this example is advantageous in that the pixel pattern can be much finer and thinner.

The constitution of this Example can be combined with any constitution of Example 1 through 13 in any desired manner. Incorporating the EL display panel having the pixel structure of this Example into the electronic appliance of Example 19 as its display part is advantageous.

EXAMPLE 17

The figure of Example 14, that are illustrated in FIG. 26A and FIG. 26B is provided with the capacitor 3504 which acts to retain the voltage applied to the gate in the current-control TFT 3503. In the example, however, the capacitor 3504 may be omitted.

In the Example 14, the current-control TFT 3503 is NTFT of the invention, as shown in Examples 1 through 11. Therefore, in the example, the LDD region is so formed that it overlaps the gate electrode with the gate-insulating film interposed therebetween. In the overlapped region, a parasitic capacitance is formed, as generally referred to as a gate capacitance. The present example is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also as illustrated in FIG. 28A, FIG. 28B and FIG. 28C of Example 16, the capacitor 3805 can be omitted.

The constitution of this Example can be combined with any constitution of Examples 1 through 13 in any desired manner. Incorporating the EL display panel having the pixel structure of the present example into the electronic appliance of Example 19 as its display part is advantageous.

Carrying out the present invention, stable operation may be obtained even when the pixel TFT of the pixel matrix circuit is driven by applying a gate voltage of 15 to 20 V. As a result, a semiconductor device including a CMOS circuit made from a crystalline TFT, specifically, a pixel matrix circuit or a driver circuit disposed at its periphery in a liquid crystal display device or an EL display device may be enhanced in reliability, providing a durable liquid crystal display device or a durable EL display device against the long time use.

EXAMPLE 18

The liquid crystal display of this invention can use a variety of liquid crystals other than a nematic liquid crystal. Examples of such liquid crystals include those disclosed in papers entitled "Characteristics and Driving Scheme of Polymer-Stabilized Monostable FLCD Exhibiting Fast Response Time and High Contrast Ratio with Gray-Scale Capability" by H. Furue, et al. 1998, SID, "A Full-Color Thresholdless Antiferroelectric LCD Exhibiting Wide Viewing Angle with Fast Response Time" by T. Yoshida, et al. 1997, SID DIGEST, 841, and "Thresholdless antiferroelectricity in liquid crystals and its application to displays" by S. Inui, et al. 1996, J. Mater. Chem. 6(4), 671–673, and those disclosed in U.S. Pat. No. 5,594,569.

Figure 29:
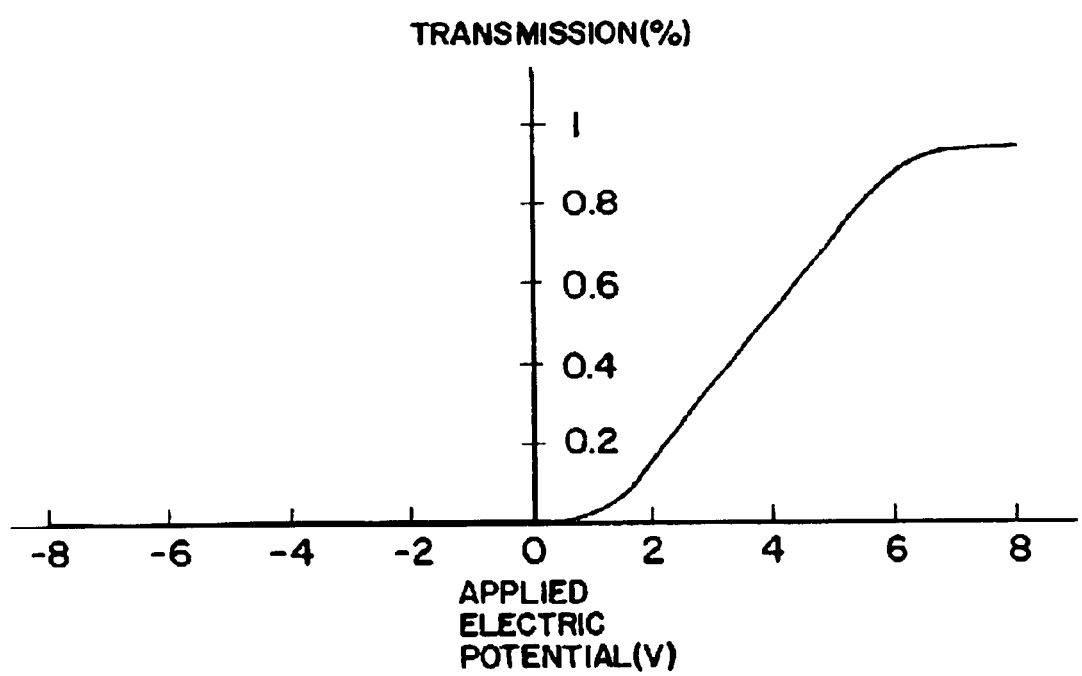
FIG. 29 is a graph showing an example light transmittivity characteristic of a ferroelectric mixed liquid crystal.

FIG. 29 shows an electrooptical characteristic of a monostable ferroelectric liquid crystal (FLC) exhibiting an isotropic phase/cholesteric phase/chiral smectic phase transition sequence when the FLC with the cone edge almost aligned to the rubbing direction is applied with a DC voltage to cause the cholesteric phase/chiral smectic phase transition.

The display mode of the ferroelectric liquid crystal as shown in FIG. 29 is called a "half-V switching mode." In the graph of FIG. 29, the ordinate represents a transmittivity (in arbitrary unit) and the abscissa an applied voltage. The "half-V switching mode" is detailed in papers such as "Half-V Switching Mode FLCD," by Terada, et al. proceedings of lectures in 46th Applied Physics Joint Conference, March 1999, p1316 and "Time-Division Full-Color LCD Using Ferroelectric Liquid Crystal" by Yoshihara, Liquid Crystal, 3rd Vol., No. 3, p190.

As shown in FIG. 29, it is seen that the use of such a ferroelectric liquid crystal enables low-voltage driving and gray-scale display. The liquid crystal display of this invention can use a ferroelectric liquid crystal exhibiting such an electrooptical characteristic.

A liquid crystal exhibiting an antiferroelectric phase in a particular temperature range is called an antiferroelectric liquid crystal (AFLC). Among mixed liquid crystals containing an antiferroelectric liquid crystal, there are thresholdless antiferroelectric mixed liquid crystals that exhibit an electrooptical response characteristic in which the transmittivity changes continuously with respect to an electric field. Some thresholdless antiferroelectric mixed liquid crystals exhibit a so-called V-type electrooptical response characteristic in which the drive voltage is about ±2.5 V (cell thickness about 1 to 2 $\mu$m).

The thresholdless antiferroelectric mixed liquid crystals generally have a high level of spontaneous polarization and therefore a high dielectric constitution. Hence, when the thresholdless antiferroelectric mixed liquid crystals are used in the liquid crystal display, the pixels are required to have a relatively large storage capacitance. It is therefore preferred that a thresholdless antiferroelectric mixed liquid crystal with small spontaneous polarization be used.

By using such a thresholdless antiferroelectric mixed liquid crystal in the liquid crystal display of this invention, a low voltage driving and therefore a low power consumption can be realized.

EXAMPLE 19

This example describes semiconductor apparatus incorporating the active matrix liquid crystal display using TFT circuits of this invention.

Such semiconductor apparatus include portable information terminals (personal digital assistants, mobile computers, cellular phones, etc.), video cameras, still cameras, personal computers and television sets. Their examples are shown in FIGS. 15, 19 and 20.

Figure 15A:
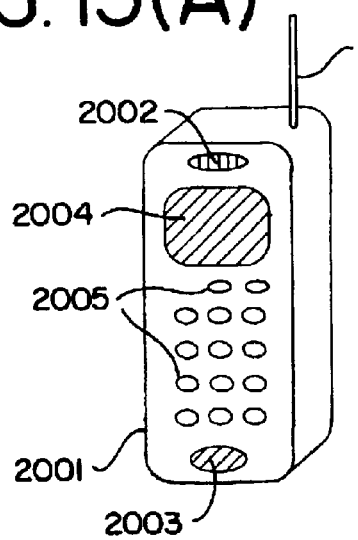
FIG. 15 is external views showing examples of semiconductor apparatus.

FIG. 15(A) shows a cellular phone, which includes a body 2001, a voice output section 2002, a voice input section 2003, a display 2004, an operation switch 2005, and an antenna 2006. This invention can be applied to the display 2004 having the voice output section 2002, the voice input section 2003 and an active matrix substrate.

Figure 15B:
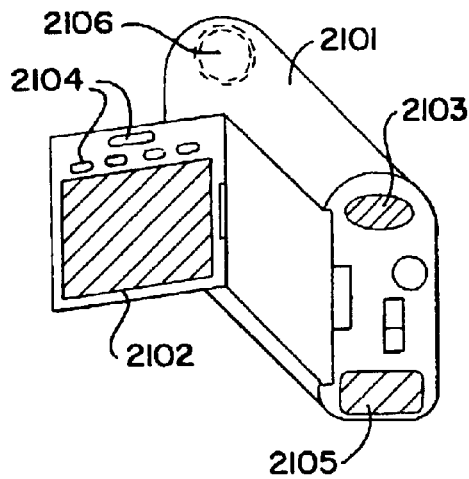

FIG. 15(B) shows a video camera, which includes a body 2101, a display 2102, a voice input section 2103, an operation switch 2104, a battery 2105, and a picture receiving section 2106. This invention can be applied to the display 2102 and the picture receiving section 2106 having the voice input section 2103, an active matrix substrate.

Figure 15C:
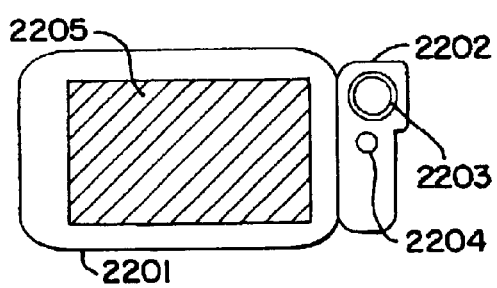

FIG. 15(C) shows a mobile computer, which includes a body 2201, a camera section 2202, a picture receiving section 2203, an operation switch 2204, and a display 2205. This invention can be applied to the picture receiving section 2203 and the display 2205 having an active matrix substrate.

Figure 15D:
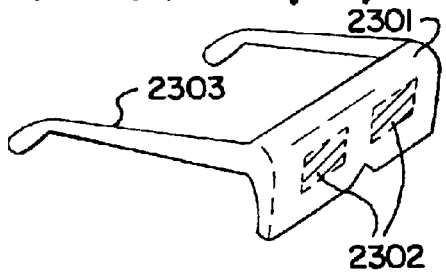

FIG. 15(D) shows a head-mounted display, which includes a body 2301, a display 2302, and an arm section 2303. This invention can be applied to the display 2302 and, though not shown, to a signal control circuit.

Figure 15E:
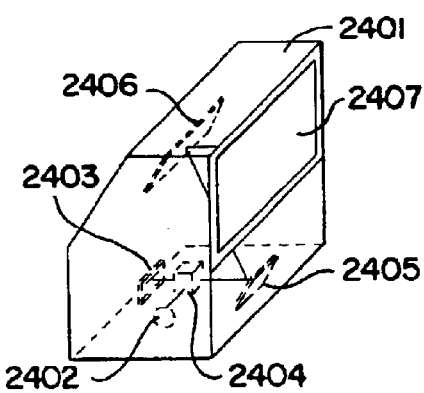

FIG. 15(E) shows a rear type projector, which includes a body 2401, a light source 2402, a display 2403, a polarizing beam splitter 2404, reflectors 2405, 2406, and a screen 2407. This invention can be applied to the display 2403.

Figure 15F:
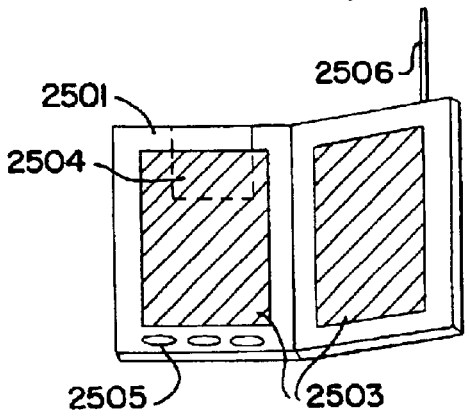

FIG. 15(F) shows a portable book, which includes a body 2501, displays 2502, 2503, a storage medium 2504, an operation switch 2505 and an antenna 2506, and designed to display data stored in minidisk (MD) and DVD and data received via antenna. The displays 2502, 2503 are direct-view type displays that can apply this invention.

Figure 19A:
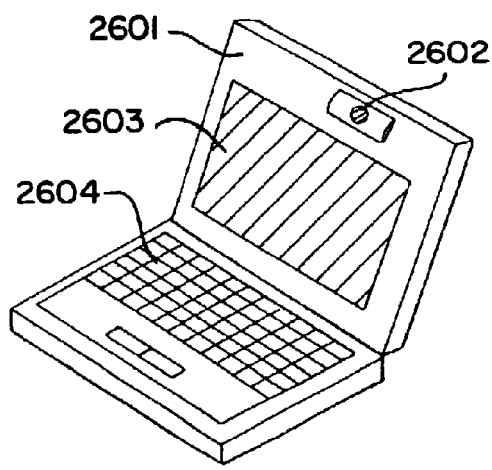
FIG. 19 is external views showing examples of semiconductor apparatus.

FIG. 19(A) shows a personal computer, which includes a body 2601 having microprocessor and memory, an image input section 2602, a display 2603 and a keyboard 2604. This invention can form the display 2603 and a signal processing circuit.

Figure 19B:
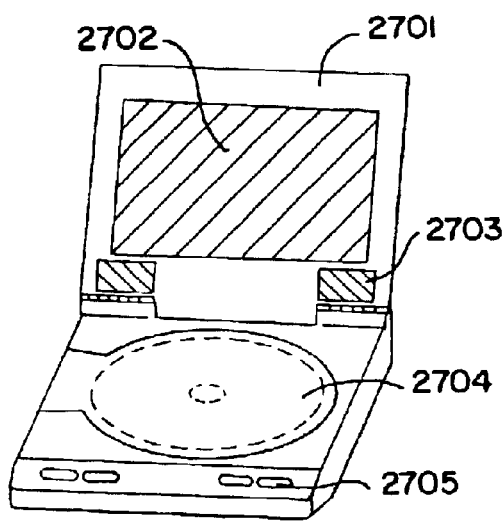

FIG. 19(B) shows a player that uses a recording medium storing a program (herein after referred to as a recording medium) and which includes a body 2701, a display 2702, a speaker 2703, a record medium 2704 and an operation switch 2705. The recording medium may be a DVD (digital versatile disk) and compact disk (CD) and used to play back music programs, display video images, play video games (or television games) and display information via Internet. This invention can be suitably applied to the display 2702 and signal control circuits.

Figure 19C:
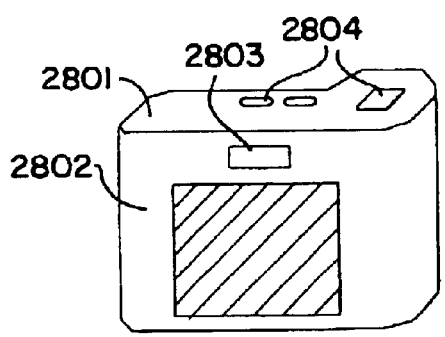

FIG. 19(C) shows a digital camera, which includes a body 2801, a display 2802, an eyepiece 2803, an operation switch 2804, and a picture receiving section (not shown). This invention can be applied to the display 2802 and signal control circuits.

Figure 20A:
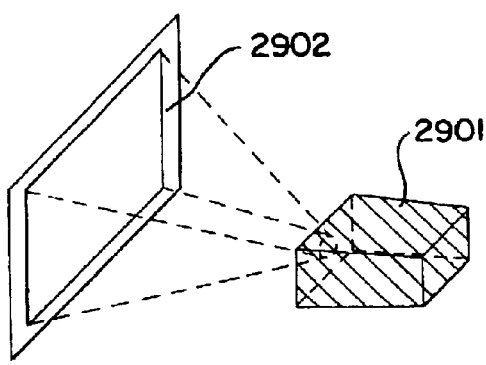
FIG. 20 is schematic diagrams showing the constitution of a projector.
Figure 20B:
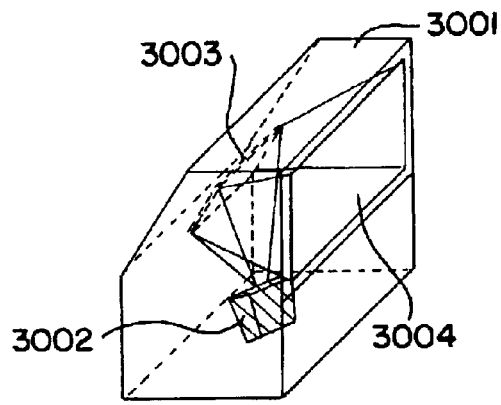

FIG. 20(A) shows a front type projector, which includes a light source optical system and display 2901 and a screen 2902. This invention can be applied to the display and signal control circuits. FIG. 20(B) shows a rear type projector, which includes a body 3001, a light source optical system and display 3002, a mirror 3003, and a screen 3004. This invention can be applied to the display and signal control circuits.

Figure 20C:
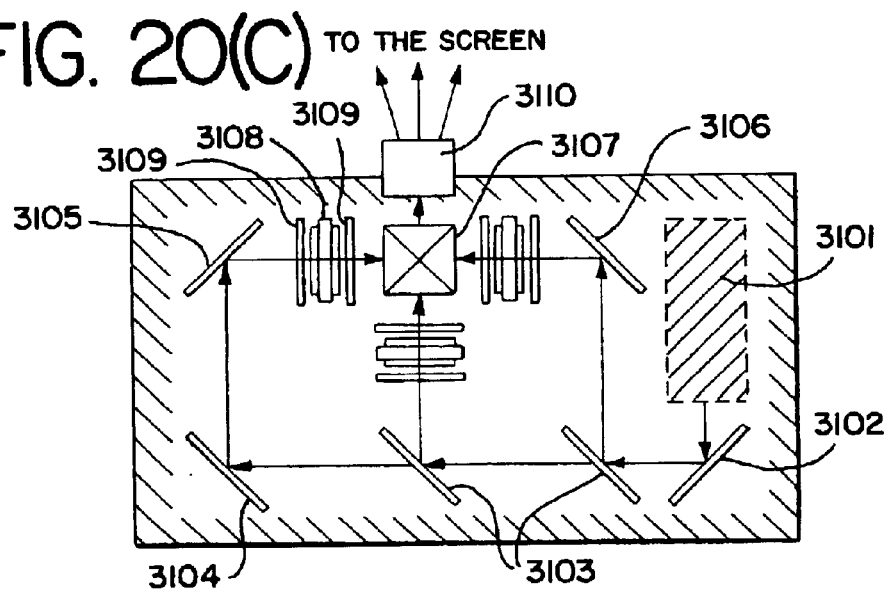
Figure 20D:
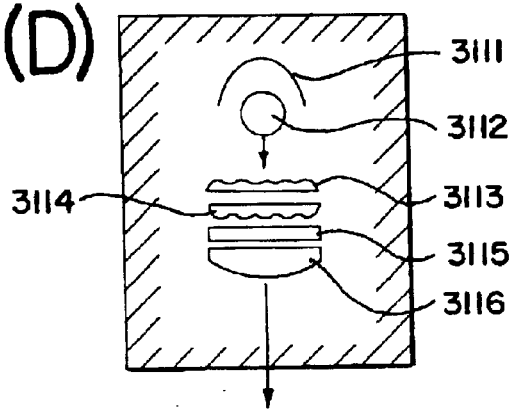

FIG. 20(C) shows one example of the constitution of the light source optical system and display 2901, 3002 of FIGS. 20(A) and 20(B). The light source optical system and display 2901, 3002 includes a light source optical system 3101, mirrors 3102, 3104–3106, a dichroic mirror 3103, a beam splitter 3107, a liquid crystal display 3108, a phase plate 3109, and a projection optical system 3110. The projection optical system 3110 comprises a plurality of optical lenses. Although FIG. 20(C) shows a three-plate type optical system that uses three liquid crystal displays 3108, the optical system is not limited to this type and a single plate type optical system may be used. In the light paths indicated by arrows in FIG. 20(C), optical lenses, polarizing films, phase adjusting films or IR films may be provided. FIG. 20(D) shows one example of the constitution of the light source optical system 3101 of FIG. 20(C). In this example, the light source optical system 3101 comprises a reflector 3111, a light source 3112, lens arrays 3113, 3114, a polarizing conversion element 3115, and a focusing lens 3116. The light source optical system shown in FIG. 20(D) is only one example and the invention is not limited to this configuration.

This invention can also be applied to navigation systems (though not shown) and reading circuits of image sensors. As described above, the invention has a very wide range of application covering electronic apparatus in every field. The electronic apparatus of this example can be realized by any combination of this example and the preceding examples 1–12. With this invention, even when the n-channel TFT in the pixel area is applied a gate voltage of 15 to 20 V, it can be operated stably. This enhances the reliability of the semiconductor devices including CMOS circuits comprising crystal TFTs and, more specifically, the reliability of the pixel area of the liquid crystal display and of the drive circuits provided at the periphery of the pixel area. The liquid crystal display fabricated with this invention therefore can withstand many hours of use.

What is claimed is:

1. A method for manufacturing a semiconductor device comprising:

a step of forming a semiconductor layer over a substrate having an insulating surface;

a step of forming a gate insulating film in contact with said semiconductor layer;

a step of forming a first conductive layer in contact with said gate insulating film;

a step of forming a first impurity region by doping an element that belongs to group 15 of the periodic table to said semiconductor layer by using said first conductive layer as a mask;

a step of forming a second conductive layer in contact with said first conductive layer and said gate insulating film;

a step of forming a second impurity region by doping an element that belongs to group 15 of the periodic table to said semiconductor layer by using said conductive layer as a mask; and a step of removing a portion of said second conductive layer.

2. A method according to claim 1 wherein said first impurity region forms an LDD region and said second impurity region forms a source region or a drain region.

3. A method according to claim 1 further comprising:
a step of doping an element that belongs to group 15 of the periodic table into a semiconductor layer extended from said second impurity region at a concentration same as said first impurity region; and
a step of forming a capacitance line comprising said first conductive layer and said second conductive layer.

4. A method according to claim 1 wherein said first conductive layer comprises an element selected from a group consisting of titanium, tantalum, tungsten and molybdenum or an alloy wherein an element selected from said group is a main component.

5. A method according to claim 1 wherein said first conductive layer comprises a conductive layer (A) formed in contact with said gate insulating film and one or a plurality of conductive layers formed over said conductive layer (A).

6. A method according to claim 5 wherein said conductive layer (A) comprises an element selected from a group comprising titanium, tantalum, tungsten and molybdenum or an alloy wherein an element selected from said group is a main component, and at least one of said one or a plurality of conductive layers comprises an element selected from aluminum or copper or an alloy comprising said element selected from aluminum or copper as a main component.

7. A method according to claim 1 wherein said second conductive layer comprises an element selected from a group consisting of titanium, tantalum, tungsten and molybdenum or an alloy wherein an element selected from said group is a main component.

8. A method according to claim 1 wherein an impurity concentration in said first impurity region is $1\times10^{16}$–$1\times10^{19}$ atoms/cm$^3$.

9. A method according to claim 1 wherein said semiconductor device is selected from a group consisting of a liquid crystal display device of transmission type, reflection type and an electro-luminescence display device.

10. A method according to claim 1 wherein said semiconductor device is selected from a group consisting of a mobile telephone, video camera, mobile information terminal, goggle type display, projection TV, mobile electronic book, personal computer, digital video disk player, digital camera, projector or liquid crystal television set.

11. A method for manufacturing a semiconductor device comprising:

a step of forming a first semiconductor layer and a second semiconductor layer over a substrate having an insulating surface;

a step of forming a gate insulating film in contact with said first semiconductor layer and said second semiconductor layer;

a step of forming a first conductive layer in contact with said gate insulating film;

a step of forming a first impurity region by doping an element that belongs to a group 15 of the periodic table into at least said first semiconductor layer by using said first conductive layer as a mask;

a step of forming a second conductive layer in contact with said first conductive layer and said gate insulating film;

a step forming a second impurity region by doping an element that belongs to group 15 of the periodic table into at least said first semiconductor layer by using said second conductive layer as a mask; and a step of forming a third impurity region by doping an element that belongs to group 13 of the periodic table into only said second semiconductor layer by using said second conductive layer as a mask.

12. A method according to claim 11 wherein said first impurity region forms an LDD region and said second impurity region forms a source region or a drain region.

13. A method according to claim 11 further comprising:
a step of doping an element that belongs to group 15 of the periodic table into a semiconductor layer extended from said second impurity region at a concentration same as said first impurity region; and
a step of forming a capacitance line comprising said first conductive layer and said second conductive layer.

14. A method according to claim 11 wherein said first conductive layer comprises an element from a group consisting of titanium, tantalum, tungsten, and molybdenum or an alloy wherein an element selected from said group is a main component.

15. A method according to claim 11 wherein said first conductive layer comprises a conductive layer (A) formed in contact with said gate insulating film and one or a plurality of conductive layers formed over said conductive layer (A).

16. A method according to claim 15 wherein said conductive layer (A) comprises an element selected from a group comprising titanium, tantalum, tungsten and molybdenum or an alloy wherein an element selected from said group is a main component, and at least one of said one or a plurality of conductive layers comprises an element selected from aluminum or copper or an alloy comprising said element selected from aluminum or copper as a main component.

17. A method according to claim 11 wherein said second conductive layer comprises an element selected from a group consisting of titanium, tantalum, tungsten and molybdenum or an alloy wherein an element selected from said group is a main component.

18. A method according to claim 11 wherein an impurity concentration in said first impurity region is $1\times10^{16}$–$1\times10^{19}$ atoms/cm$^3$.

19. A method according to claim 11 wherein said semiconductor device is selected from a group consisting of a liquid crystal display device of transmission type, reflection type and an electro-luminescence display device.

20. A method according to claim 11 wherein said semiconductor device is selected from a group consisting of a mobile telephone, video camera, mobile information terminal, goggle type display, projection TV, mobile electronic book, personal computer, digital video disk player, digital camera, projector or liquid crystal television set.

21. A method for manufacturing a semiconductor device comprising:

a step of forming a first semiconductor layer and a second semiconductor layer over a substrate having an insulating surface;

a step of forming a gate insulating film in contact with said first semiconductor layer and said second semiconductor layer;

a step of forming a first conductive layer in contact with said gate insulating film;

a step of forming a first impurity region by doping an element that belongs to group 15 of the periodic table into at least said first semiconductor layer by using said first conductive layer as a mask;

a step of forming a second conductive layer in contact with said first conductive layer and said gate insulating film;

a step of forming a second impurity region by doping a element that belongs to a group 15 of the periodic table into at least said first semiconductor layer by using said first conductive layer as a mask;

a step of removing a portion of said second conductive layer; and a step of forming a third impurity region by doping an element that belongs to group 13 of the periodic table into at least said first semiconductor layer by using said second conductive layer as a mask.

22. A method according to claim 21 wherein said first impurity region forms an LDD region and said second impurity region forms a source region or a drain region.

23. A method according to claim 21 further comprising:

a step of doping an element that belongs to group 15 of the periodic table into a semiconductor layer extended from said second impurity region at a concentration same as said first impurity region; and a step of forming a capacitance line comprising said first conductive layer and said second conductive layer.

24. A method according to claim 21 wherein said first conductive layer comprises an element selected from a group consisting of titanium, tantalum, tungsten and molybdenum or an alloy wherein an element from said group is a main component.

25. A method according to claim 21 wherein said first conductive layer comprises a conductive layer (A) formed in contact with said gate insulating film and one of a plurality of conductive layers formed over said conductive layer (A).

26. A method according to claim 25 wherein said conductive layer (A) comprises an element selected from a group comprising titanium, tantalum, tungsten and molybdenum or an alloy wherein an element selected from said group is a main component and at least one of said one or a plurality of conductive layers comprises an element selected from aluminum or copper or an alloy comprising said element selected from aluminum or copper as a main component.

27. A method according to claim 21 wherein said second conductive layer comprises an element from a group consisting of titanium, tantalum, tungsten and molybdenum or an alloy wherein an element selected from said group is a main component.

28. A method according to claim 21 wherein an impurity concentration in said first impurity is $1\times10^{16}$–$1\times10^{19}$ atoms/cm$^3$.

29. A method according to claim 21 wherein said semiconductor device is selected from a group consisting of a liquid crystal display device of transmission type, reflection type and an electro-luminescence display device.

30. A method according to claim 21 wherein said semiconductor device is selected from a group consisting of a mobile telephone, video camera, mobile information terminal, goggle type display, projection TV, mobile electronic book, personal computer, digital video disk player, digital camera, projector or liquid crystal television set.

* * * * *